US011495276B2

(12) United States Patent
Kim et al.

(10) Patent No.: US 11,495,276 B2
(45) Date of Patent: Nov. 8, 2022

(54) ELECTRONIC DEVICES FOR CONTROLLING CLOCK GENERATION

(71) Applicant: SK hynix Inc., Icheon-si (KR)

(72) Inventors: Woongrae Kim, Icheon-si (KR); Kyung Mook Kim, Icheon-si (KR); Seung Hun Lee, Icheon-si (KR); Da In Im, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 25 days.

(21) Appl. No.: 17/354,815

(22) Filed: Jun. 22, 2021

(65) Prior Publication Data

US 2021/0350839 A1 Nov. 11, 2021

Related U.S. Application Data

(63) Continuation-in-part of application No. 16/991,754, filed on Aug. 12, 2020, now Pat. No. 11,169,562.

(30) Foreign Application Priority Data

May 7, 2020 (KR) ........................ 10-2020-0054289

(51) Int. Cl.
*G11C 7/22* (2006.01)
*G11C 8/18* (2006.01)
*G11C 8/12* (2006.01)

(52) U.S. Cl.
CPC ................ *G11C 7/222* (2013.01); *G11C 8/12* (2013.01); *G11C 8/18* (2013.01); *G11C 7/22* (2013.01)

(58) Field of Classification Search
CPC ....................................................... G11C 7/22
USPC .......................................................... 365/194
See application file for complete search history.

(56) References Cited

U.S. PATENT DOCUMENTS 9,536,591 B1 * 1/2017 Kwak .................... G11C 5/025
10,438,650 B1 10/2019 Yamashita et al.
2004/0027902 A1 2/2004 Ooishi et al.

FOREIGN PATENT DOCUMENTS

KR 1020200055930 A 5/2020

* cited by examiner

*Primary Examiner* — Jason Lappas
(74) *Attorney, Agent, or Firm* — William Park & Associates Ltd.

(57) ABSTRACT

An electronic device includes a shifting circuit and a clock repeater. The shifting circuit is configured to generate a write shifting flag that is inactivated when a write signal for a write operation is activated. The clock repeater is configured to block generation of a read repeating clock that is used in a read operation when the write shifting flag is inactivated.

25 Claims, 31 Drawing Sheets

203

ELECTRONIC DEVICES FOR CONTROLLING CLOCK GENERATION

CROSS-REFERENCE TO RELATED APPLICATIONS

The present application is a continuation-in-part of U.S. patent application Ser. No. 16/991,754, filed on Aug. 12, 2020, which claims priority under 35 U.S.C. 119(a) to Korean Patent Application No. 10-2020-0054289, filed on May 7, 2020, which is incorporated herein by reference in its entirety.

BACKGROUND

1. Technical Field

Embodiments of the present disclosure relate to electronic devices for controlling clock generation.

2. Related Art

Semiconductor devices may receive commands to perform various internal operations including an active operation, a write operation, a read operation, and a pre-charge operation. Recently, in the case of semiconductor devices applied to mobile systems, a power-down mode capable of interrupting generation of a clock used for an internal operation has been provided to reduce power consumption. However, because the semiconductor devices have to receive commands to perform various internal operations, it may be difficult to completely interrupt the generation of the clock as the generation of the cock is interrupted in the power-down mode, Accordingly, the semiconductor devices generate the dock for receiving commands necessary for the internal operation in a standby mode.

SUMMARY

According to an embodiment, an electronic device includes a shifting circuit and a clock repeater. The shifting circuit is configured to generate a write shifting flag that is inactivated when a write signal for a write operation is activated. The dock repeater is configured to block generation of a read repeating dock that is used in a read operation when the write shifting flag is inactivated.

According to yet another embodiment, an electronic device includes a shifting circuit and a clock repeater. The shifting circuit is configured to generate a read shifting flag that is inactivated when a read signal for a read operation is activated. The clock repeater is configured to block generation of a write repeating clock that is used in a write operation when the read shifting flag is inactivated.

According to still yet another embodiment, an electronic device includes a command decoder, a shifting circuit, and a clock repeater. The command decoder is configured to decode an internal command according to an internal chip selection signal to generate a write signal and a read signal. The shifting circuit is configured to generate a write shifting flag and a write enable signal based on the write signal, and generates a read shifting flag and a read enable signal based on the read signal. The dock repeater is configured to generate a read repeating dock from a read gating dock based on the write shifting flag and the read enable signal.

DETAILED DESCRIPTION OF THE EMBODIMENTS

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc, are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
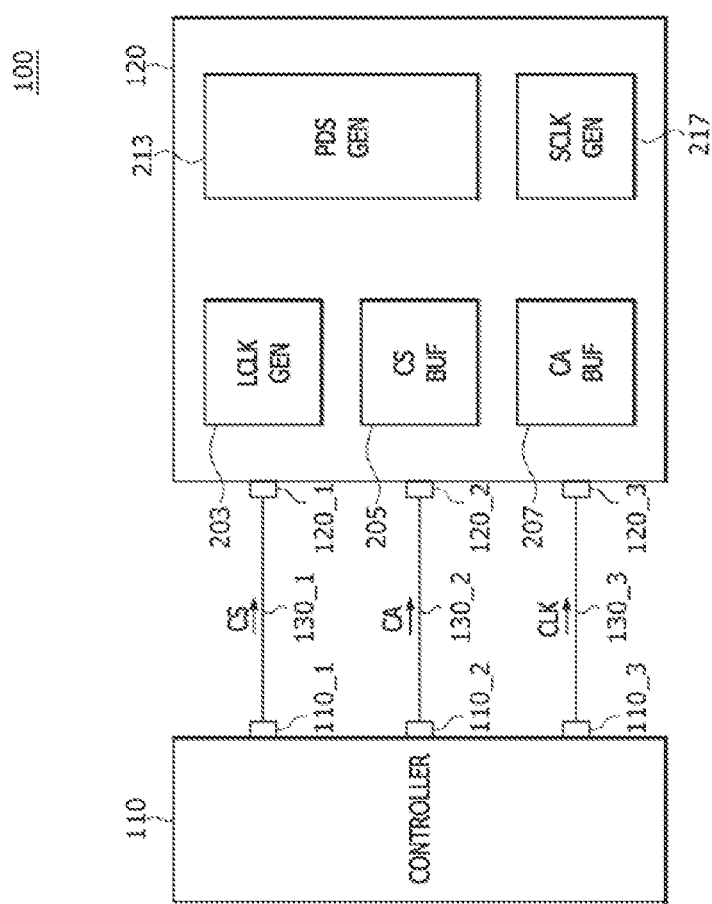
FIG. 1 is a block diagram illustrating a configuration of an electronic system according to an embodiment of the present disclosure.

FIG. 1 is a block diagram illustrating a configuration of an electronic system 100 according to an embodiment of the present disclosure. As illustrated in FIG. 1, the electronic system 100 may include a controller 110 and an electronic device 120. The controller 110 may include a first control pin 110_1, a second control pin 110_2, and a third control pin 110_3. The electronic device 120 may include a first device pin 120_1, a second device pin 120_2, and a third device pin 120_3. The controller 110 may transmit a chip selection signal CS to the electronic device 120 through a first transmission line 130_1 connected between the first control pin 110_1 and the first device pin 120_1. The controller 110 may transmit a command CA to the electronic device 120 through a second transmission line 130_2 connected between the second control pin 110_2 and the second device pin 120_2. The controller 110 may transmit a clock CLK to the electronic device 120 through a third transmission line 130_3 connected between the third control pin 110_3 and the third device pin 120_3. The electronic system 100 may be configured to transmit the command CA including an address through the second transmission line 130_2 connected between the second control pin 110_2 and the second device pin 120_2 according to the embodiments.

The electronic device 120 may be a semiconductor device. The electronic device 120 may receive the chip selection signal CS, the command CA, and the dock CLK from the controller 110 to perform various internal operations including an active operation, a write operation, a read operation, and a pre-charge operation. The electronic device 120 may include a latch clock generation circuit (LCLK GEN) 203 that detects a time when the chip selection signal CS is activated to activate a latch clock (LCLK of FIG. 2). The electronic device 120 may include a chip selection signal buffer circuit (CS BUF) 205 and a command buffer circuit (CA BUF) 207 to latch the chip selection signal CS and the command CA when the latch clock LCLK is activated. Accordingly, the electronic device 120 according to the present embodiment may reduce power consumption, which is due to the latch clock LCLK unnecessarily activated before the chip selection signal CS is activated, by activating the latch clock LCLK for latching the chip selection signal CS and the command CA after the chip selection signal CS is activated. The electronic device 120 may include a period signal generation circuit (PDS GEN) 213 and a shifting clock generation circuit (SCLK GEN) 217 capable of activating a shifting clock (SCLK in FIG. 2) for setting a write latency and a read latency after the chip selection signal CS is activated. Accordingly, the electronic device 120 according to the present embodiment may reduce power consumption during the read operation and the write operation by activating the shifting clock SCLK after the chip selection signal CS is activated.

Figure 2:
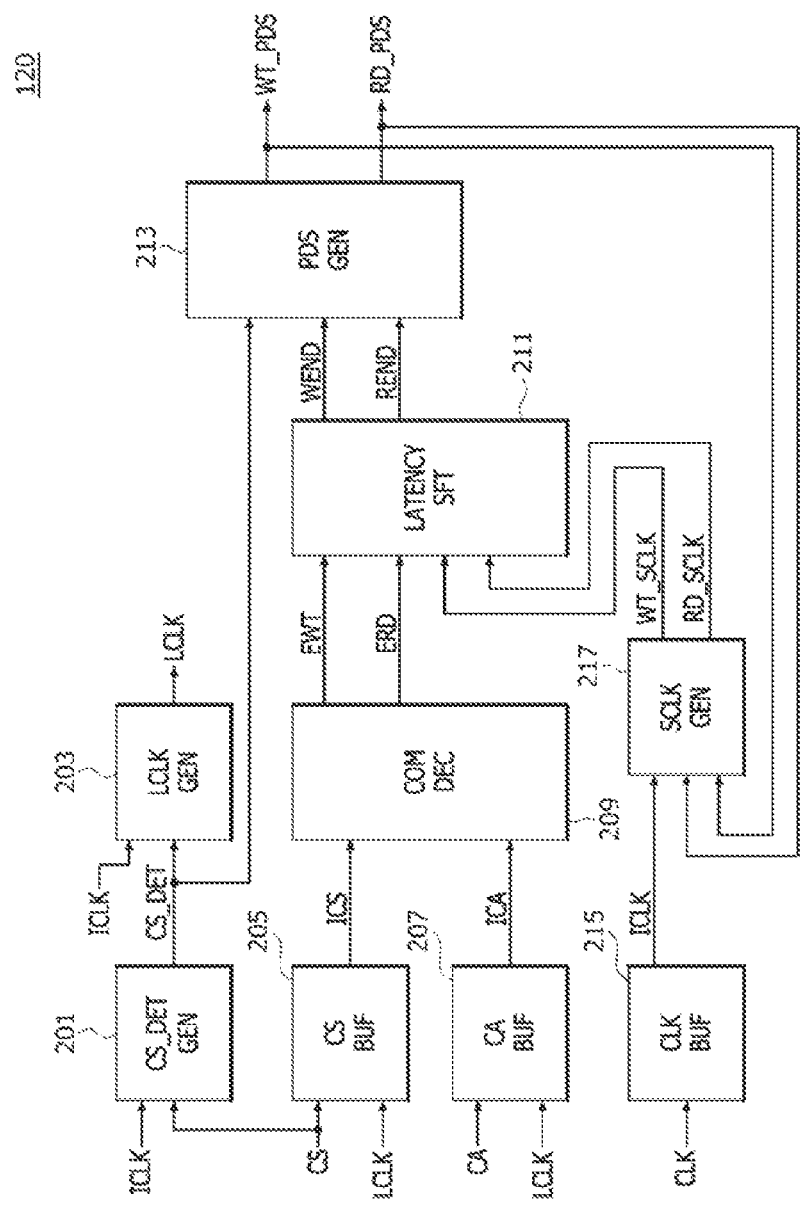
FIG. 2 is a block diagram illustrating a configuration of an electronic device included in the electronic system illustrated in FIG. 1.

FIG. 2 is a block diagram illustrating a configuration of the electronic device 120. As illustrated in FIG. 2, the electronic device 120 may include a detection signal generation circuit (CS_DET GEN) 201, the latch clock generation circuit (LCLK GEN) 203, the chip selection signal buffer circuit (CS BUF) 205, the command buffer circuit (CA BUF) 207, a command decoder (COM DEC) 209, a latency shifting circuit (LATENCY SFT) 211, the period signal generation circuit (PDS GEN) 213, a clock buffer circuit (CLK BUF) 215, and the shifting clock generation circuit (SCLK GEN) 217.

The detection signal generation circuit 201 may generate a detection signal CS_DET based on an internal clock ICLK and the chip selection signal CS. The detection signal generation circuit 201 may activate the detection signal CS_DET when the chip selection signal CS is activated. The chip selection signal CS may be activated by maintaining a predetermined logic level during a predetermined period. For example, the chip selection signal CS may be activated by maintaining a logic "high" level for one cycle of the clock CLK. A logic level of the chip selection signal CS which is activated may be set to be different according to the embodiments. In addition, a period of the chip selection signal CS which is activated may be set to be different according to the embodiments. The detection signal CS_DET may be activated to have the predetermined logic level. For example, the detection signal CS_DET may be activated to have a logic "high" level. When the chip selection signal CS is inactivated after being activated, the detection signal CS_DET may be inactivated at a point in time when a predetermined number of cycles of the internal clock ICLK elapse from a point in time when the chip selection signal CS is inactivated. For example, the detection signal CS_DET may be inactivated at a point in time when two cycles of the internal clock ICLK elapse from a point in time when the chip selection signal CS is inactivated.

The latch clock generation circuit 203 may generate the latch clock LCLK based on the detection signal CS_DET and the internal clock ICLK. The latch clock generation circuit 203 may buffer the internal clock ICLK to output the buffered signal of the internal clock ICLK as the latch clock LCLK when the detection signal CS_DET is activated. The latch clock generation circuit 203 may activate the latch clock LCLK while the detection signal CS_DET is activated.

The chip selection signal buffer circuit 205 may generate an internal chip selection signal ICS based on the latch clock LCLK and the chip selection signal CS. The chip selection signal buffer circuit 205 may latch the chip selection signal CS to output the latched signal of the chip selection signal CS as the internal chip selection signal ICS when the latch clock LCLK is activated. The chip selection signal buffer circuit 205 might latch the chip selection signal CS only when the latch clock LCLK is activated, thereby reducing power consumption.

The command buffer circuit 207 may generate an internal command ICA based on the latch dock LCLK and the command CA. When the latch dock LCLK is activated, the command buffer circuit 207 may latch the command CA to output the latched signal of the command CA as the internal command ICA. The command buffer circuit 207 might latch the command CA only when the latch clock LCLK is activated, thereby reducing power consumption.

The command decoder 209 may generate an internal operation signal based on the internal chip selection signal ICS and the internal command ICA. The internal operation signal may include a write signal EWT and a read signal ERD. The command decoder 209 may generate the write signal EWT and the read signal ERD by decoding the internal command ICA based on the internal chip selection signal ICS. The command decoder 209 may activate the write signal EWT and the read signal ERD by decoding the internal command ICA sequentially inputted based on the internal chip selection signal ICS. For example, the write signal EWT may be activated when the internal command ICA having a first logic level combination is inputted based on the internal chip selection signal ICS, and the read signal ERD may be activated when the internal command ICA having a second logic level combination is inputted based on the internal chip selection signal ICS. The write signal EWT may be activated during the write operation. The read signal ERD may be activated during the read operation. For example, each of the write signal EWT and the read signal ERD nay be activated to provide a pulse having a logic "high" level.

The latency shifting circuit 211 may generate end signals based on the write signal EWT, the read signal ERD, a write shifting clock WT_SCLK, and a read shifting clock RD_SCLK. The end signals may include a write end signal WEND and a read end signal REND, The latency shifting circuit 211 may generate the write end signal WEND that maintains an inactivated state from a point in time when the write signal EWT is activated until a point in time when a period set by a write latency elapses from a point in time when the write signal EWT is activated. The write end signal WEND may be activated while the write operation is not performed. For example, the write end signal WEND may be activated to have a logic "high" level while the write operation is not performed and may be inactivated to have a logic "low" level while the write operation is performed. The write end signal WEND may maintain an inactivated state during a period set by the write latency through a shifting operation performed based on the write shifting clock WT_SCLK. The latency shifting circuit 211 may generate the read end signal REND maintaining an inactivated state from a point in time when the read signal ERD is activated until a point in time when a period set by a read latency based on the read shifting clock RD_SCLK elapses from a point in time when the read signal ERD is activated. The read end signal REND may be activated while the read operation is not performed. For example, the read end signal REND may be activated to have a logic "high" level while the read operation is not performed and may be inactivated to have a logic "low" level while the read operation is performed. The read end signal REND may maintain an inactivated state during a period set by the read latency through a shifting operation based on the read shifting dock RD_SCLK.

The period signal generation circuit 213 may generate period signals based on the detection signal CS_DET, the write end signal WEND, and the read end signal REND. The period signals may include a write period signal WT_PDS and a read period signal RD_PDS. The period signal generation circuit 213 may activate the write period signal WT_PDS and the read period signal RD_PDS when the detection signal CS_DET is activated. The period signal generation circuit 213 may inactivate the write period signal WT_PDS when the detection signal CS_DET is inactivated and the write end signal WEND is activated. The write period signal WT_PDS may be activated during a relatively longer period when the write operation is performed, as compared with the cases that the active operation, the read operation, and the pre-charge operation are performed. The period signal generation circuit 213 may inactivate the read period signal RD_PDS when the detection signal CS_DET is inactivated and the read end signal REND is activated. The read period signal RD_PDS may be activated during a relatively longer period when the read operation is performed, as compared with the cases that the active operation, the write operation, and the pre-charge operation are performed.

The clock buffer circuit 215 may generate the internal clock ICLK based on the clock CLK. The clock buffer circuit 215 may generate the internal clock ICLK by buffering the clock CLK. According to the embodiments, the clock buffer circuit 215 may also generate the internal clock ICLK by dividing the clock CLK.

The shifting clock generation circuit 217 may generate shifting clocks based on the internal clock ICLK, the write period signal WT_PDS, and the read period signal RD_PDS. The shifting clocks may include the write shifting clock WT_SCLK and the read shifting clock RD_SCLK. The shifting clock generation circuit 217 may buffer the internal clock ICLK to output the buffered signal of the internal clock ICLK as the write shifting clock WT_SCLK while the write period signal WT_PDS is activated. The shifting clock generation circuit 217 may buffer the internal clock ICLK to output the buffered signal of the internal clock ICLK as the read shifting clock RD_SCLK while the read period signal RD_PDS is activated.

Figure 3:
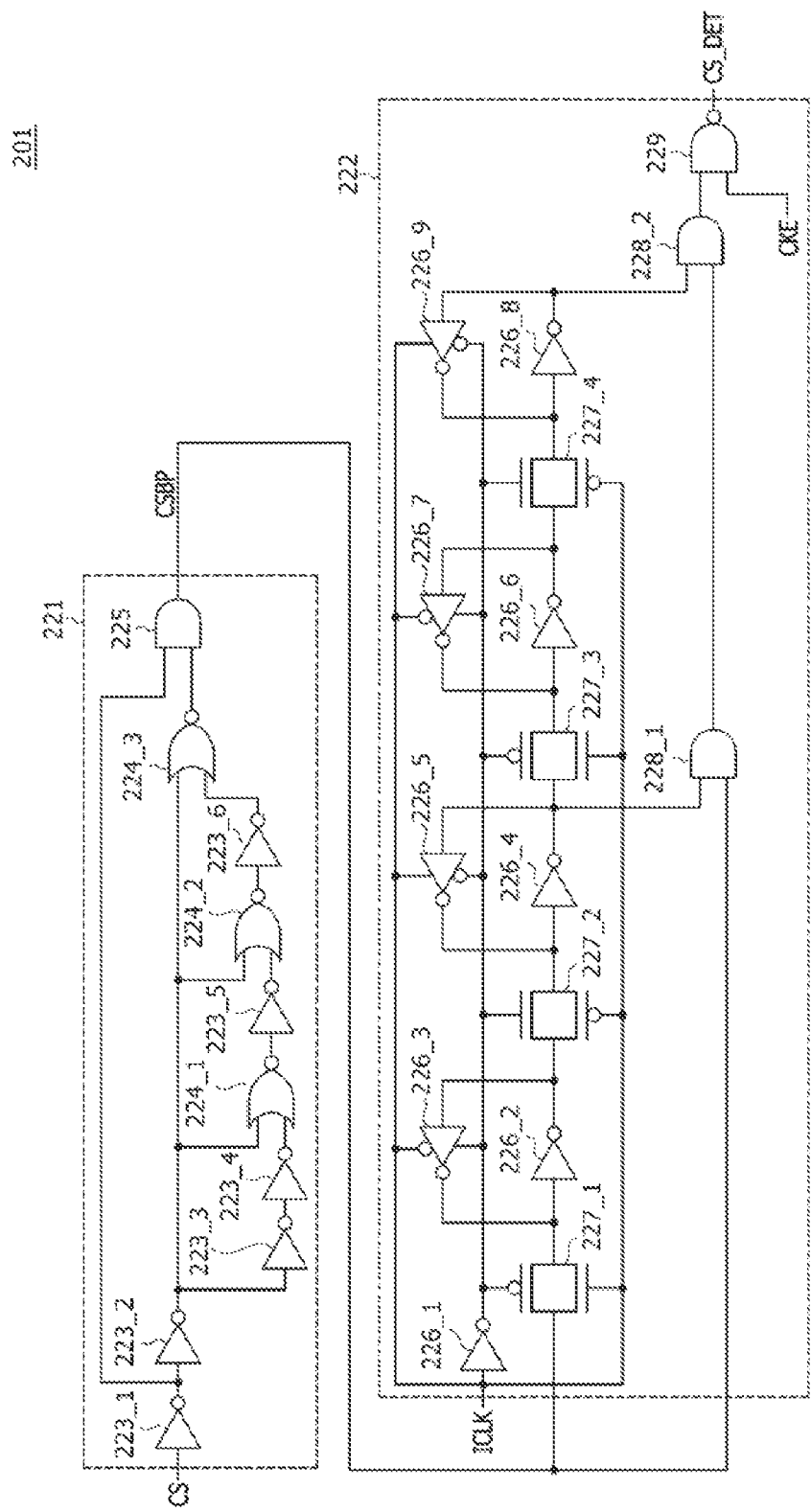
FIG. 3 is a circuit diagram illustrating a detection signal generation circuit included in the electronic device illustrated in FIG. 2.

FIG. 3 is a circuit diagram illustrating an example of the detection signal generation circuit 201. As illustrated in FIG. 3, the detection signal generation circuit 201 may include a chip selection pulse generation circuit 221 and a detection signal output circuit 222.

The chip selection pulse generation circuit 221 may include inverters 223_1 to 223_6, NOR gates 224_1 to 224_3, and an AND gate 225. The inverter 223_1 may inversely buffer the chip selection signal CS. The inverter 223_2 may inversely buffer an output signal of the inverter 223_1. The inverter 223_3 may inversely buffer an output signal of the inverter 223_2. The inverter 223_4 may inversely buffer an output signal of the inverter 223_3. The NOR gate 224_1 may receive the output signal of the inverter 223_2 and an output signal of the inverter 223_4 to perform a logical NOR operation. The inverter 223_5 may inversely buffer an output signal of the NOR gate 224_1. The NOR gate 224_2 may receive the output signal of the inverter 223_2 and an output signal of the inverter 223_5 to perform a logical NOR operation. The inverter 223_6 may inversely buffer an output signal of the NOR gate 224_2. The NOR gate 224_3 may receive the output signal of the inverter 223_2 and an output signal of the inverter 223_6 to perform a logical NOR operation. The AND gate 225 may receive the output signal of the inverter 223_1 and an output signal of the NOR gate 224_3 to perform a logical AND operation. The chip selection pulse generation circuit 221 may generate a chip selection pulse signal CSBP having a logic "low" level when the chip selection signal CS is activated so that a logic level of the chip selection signal CS changes from a logic "low" level into a logic "high" level. If the chip selection signal CS is inactivated so that a logic level of chip selection signal CS changes from a logic "high" level into a logic "low" level, the chip selection pulse generation circuit 221 may change a logic level of the chip selection puke signal CSBP from a logic "low"" level into a logic "high"" level at a point in time when a period set by the inverters 223_1 to 223_6, the NOR gates 224_1 to 224_3, and the AND gate 225 elapses from a point in time when the chip selection signal CS is inactivated.

The detection signal output circuit 222 may include inverters 226_1 to 226_9, transfer gates 227_1 to 227_4, AND gates 228_1 and 228_2, and a NAND gate 229. The inverter 226_1 may inversely buffer the internal clock ICLK. The transfer gate 227_1 may be turned on to transmit the chip selection pulse signal CSBP when the internal clock ICLK has a logic "high" level. The inverters 226_2 and 226_3 may inversely buffer an output signal of the transfer gate 227_1 and may latch the output signal of the transfer gate 227_1 when the internal clock ICLK has a logic "low" level. The transfer gate 227_2 may be turned on to transmit an output signal of the inverter 226_2 when the internal clock ICLK has a logic "low" level. The inverters 226_4 and 226_5 may inversely buffer an output signal of the transfer gate 227_2 and may latch the output signal of the transfer gate 227_2 when the internal clock ICLK has a logic "high" level. The transfer gate 227_3 may be turned on to transmit an output signal of the inverter 226_4 when the internal clock ICLK has a logic "high" level. The inverters 226_6 and 226_7 may inversely buffer an output signal of the transfer gate 227_3 and may latch the output signal of the transfer gate 227_8 when the internal clock ICLK has a logic "low" level. The transfer gate 227_4 may be turned on to transmit the output signal of the inverter 226_6 when the internal clock ICLK has a logic "low" level. The inverters 226_8 and 226_9 may inversely buffer an output signal of the transfer gate 227_4 and may latch the output signal of the transfer gate 227_4 when the internal clock ICLK has a logic "high" level. The AND gate 228_1 may receive the chip selection pulse signal CSBP and an output signal of the inverter 226_4 to perform a logical AND operation. The AND gate 228_2 may receive an output signal of the AND gate 228_1 and an output signal of the inverter 226_8 to perform a logical AND operation. The NAND gate 229 may receive a clock enable signal CKE and an output signal of the AND gate 228_2 to perform a logical NAND operation. The clock enable signal CKE may be generated to have a logic "high" level out of the power-down mode and may be generated to have a logic "low" level in the power-down mode. The detection signal output circuit 222 may generate the detection signal CS_DET which is activated to have a logic "high" level based on the clock enable signal CKE having a logic "low" level in the power-down mode. The detection signal CS_DET has to be activated in the power-down mode because the electronic device 120 has to receive the command CA to exit the power-down mode. The detection signal output circuit 222 may generate the detection signal CS_DET activated to have a logic "high" level when the chip selection pulse signal CSBP has a logic "low" level. The detection signal output circuit 222 may inactivate the detection signal CS_DET into a logic "low" level at point in time when two cycles of the internal dock ICLK elapse from a point in time when a logic level of the chip selection pulse signal CSBP changes from a logic "low" level into a logic "high" level.

The detection signal generation circuit 201 having the aforementioned configuration may activate the detection signal CS_DET to a logic "high" level when the electronic device 120 enters the power-down mode or when the chip selection signal CS is activated to have a logic "high" level and may inactivate the detection signal CS_DET to a logic "low" level at a point in time when two cycles of the internal clock ICLK elapse from a point in time when the chip selection signal CS is inactivated to have a logic "low" level.

Figure 4:
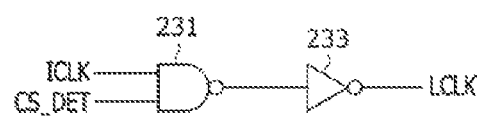
FIG. 4 is a circuit diagram illustrating a latch clock generation circuit included in the electronic device illustrated in FIG. 2.

FIG. 4 is a circuit diagram illustrating an example of the latch clock generation circuit 203. As illustrated in FIG. 4, the latch clock generation circuit 203 may include a NAND gate 231 and an inverter 233 and may receive the detection signal CS_DET and the internal clock ICLK to perform a logical AND operation. The latch clock generation circuit 203 may buffer the internal clock ICLK to output the buffered signal of the internal clock ICLK as the latch clock LCLK when the detection signal CS_DET is activated to have a logic "high" level. The latch clock generation circuit 203 might activate the latch clock LCLK only while the detection signal CS_DET is activated to have a logic "high" level, thereby reducing power consumption.

Figure 5:
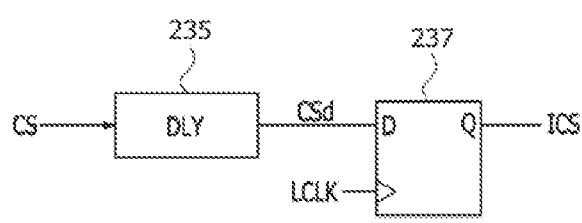
FIG. 5 illustrates a chip selection signal buffer circuit included in the electronic device illustrated in FIG. 2.

FIG. 5 illustrates an example of the chip selection signal buffer circuit 205. As illustrated in FIG. 5, the chip selection signal buffer circuit 205 may include a chip selection signal delayer 235 and a chip selection signal latch 237. The chip selection signal delayer 235 may generate a delayed chip selection signal CSd by delaying the chip selection signal CS. The chip selection signal latch 237 may latch the delayed chip selection signal CSd when the latch clock LCLK is activated and may output the latched signal of the delayed chip selection signal CSd as the internal chip selection signal ICS. The chip selection signal buffer circuit 205 might latch the delayed chip selection signal CSd only when the latch clock LCLK is activated, thereby reducing power consumption.

Figure 6:
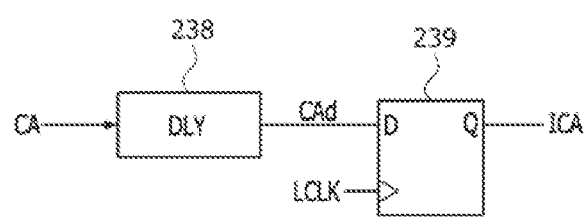
FIG. 6 illustrates a command buffer circuit included in the electronic device illustrated in FIG. 2.

FIG. 6 illustrates an example of the command buffer circuit 207. As illustrated in FIG. 6, the command buffer circuit 207 may include a command delayer 238 and a command latch 239. The command delayer 238 may delay the command CA to generate a delayed command CAd. The command latch 239 may latch the delayed command CAd when the latch clock LCLK is activated and may output the latched signal of the delayed command CAd as the internal command ICA. The command buffer circuit 207 might latch the delayed command CAd only when the latch clock LCLK is activated, thereby reducing power consumption.

Figure 7:
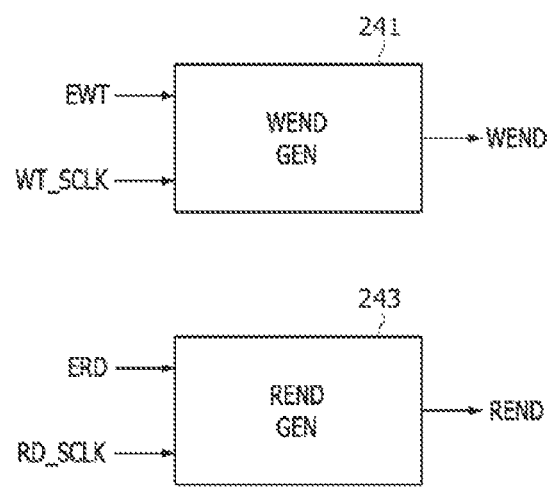
FIG. 7 is a block diagram illustrating a configuration of a latency shifting circuit included in the electronic device illustrated in FIG. 2.

FIG. 7 is a block diagram illustrating a configuration of the latency shifting circuit 211. As illustrated in FIG. 7, the latency shifting circuit 211 may include a write end signal generation circuit 241 and a read end signal generation circuit 243. The write end signal generation circuit 241 may generate the write end signal WEND based on the write signal EWT and the write shifting clock WT_SCLK. The write end signal generation circuit 241 may generate the write end signal WEND maintaining an inactivated state from a point in time when the write signal EWT is activated until a point in time when a period set by a write latency elapses from a point in time when the write signal EWT is activated. For example, when the write latency is set to have eight cycles of the internal clock ICLK, the write end signal generation circuit 241 may generate the write end signal WEND remaining an inactivated state from a point in time when the write signal EWT is activated until a point in time when eight cycles of the internal clock ICLK elapse from a point in time when the write signal EWT is activated. The write end signal WEND may be activated before the write signal EWT is activated or after a point in time when eight cycles of the internal clock ICLK elapse from the point in time when the write signal EWT is activated. The read end signal generation circuit 243 may generate the read end signal REND based on the read signal ERD and the read shifting clock RD_SCLK. The read end signal generation circuit 243 may generate the read end signal REND maintaining an inactivated state from a point in time when the read signal ERD is activated until a point in time when a period set by a read latency elapses from a point in time when the read signal ERD is activated. For example, when the read latency is set to have 16 cycles of the internal dock ICLK, the read end signal generation circuit 243 may generate the read end signal REND remaining an inactivated state from a point in time when the read signal ERD is activated until a point in time when 16 cycles of the internal dock ICLK elapse from a point in time when the read signal ERD is activated. The read end signal REND may be activated before the read signal ERD is activated or after a point in time when 16 cycles of the internal dock ICLK elapse from the point in time the read signal ERD is activated.

Figure 8:
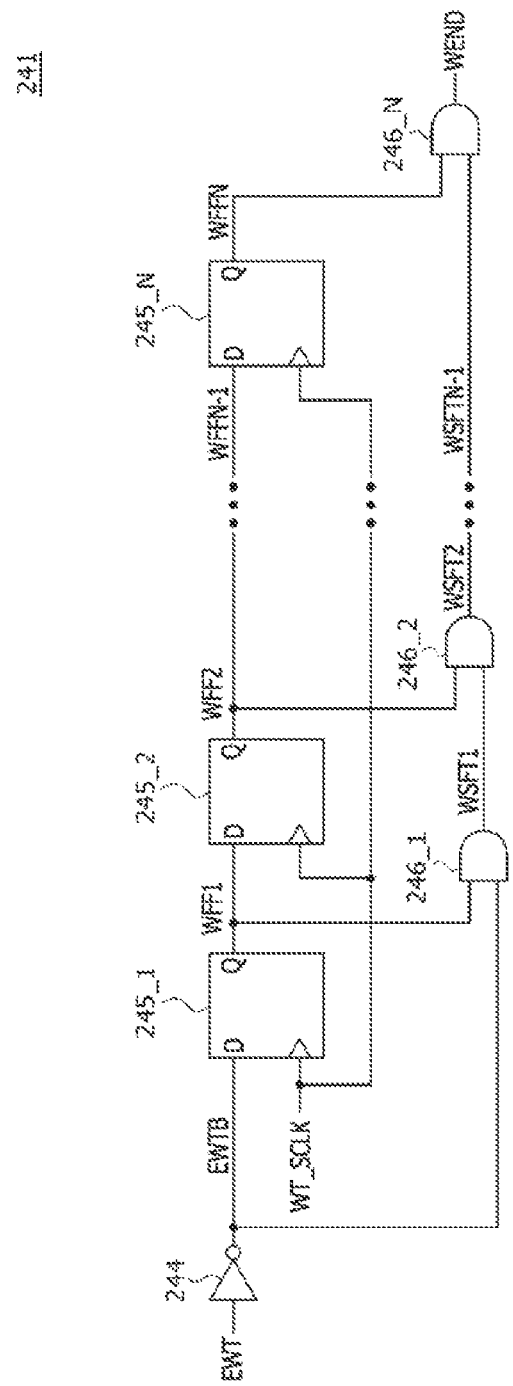
FIG. 8 is a circuit diagram illustrating a write end signal generation circuit included in the latency shifting circuit illustrated in FIG. 7.

FIG. 8 is a circuit diagram illustrating an example of the write end signal generation circuit 241. As illustrated in FIG. 8, the write end signal generation circuit 241 may include an inverter 244, first to $N^{th}$ write shifting latches 245_1 to 245_N, and first to $N^{th}$ AND gates 246_1 to 246_N. The inverter 244 may inversely buffer the write signal EWT to generate an inverted write signal EWTB. The first write shifting latch 245_1 may be synchronized with the write shifting clock WT_SCLK to latch the inverted write signal EWTB and may output the latched signal of the inverted write signal EWTB as a first write latch signal WFF1. The second write shifting latch 245_2 may be synchronized with the write shifting clock WT_SCLK to latch the first write latch signal WFF1 and may output the latched signal of the first write latch signal WFF1 as a second write latch signal WFF2. The $N^{th}$ write shifting latch 245_N may be synchronized with the write shifting dock WT_SCLK to latch an $N-1^{th}$ write latch signal WFFN-1 and may output the latched signal of the N-1$^{th}$ write latch signal WFFN-1 as an $N^{th}$ write latch signal WFFN. The first AND gate 246_1 may perform a logical NAD operation of the inverted write signal EWTB and the first write latch signal WFF1 to generate a first write shifting signal WSFT1. The second AND gate 246_2 may perform a logical AND operation of the first write shifting signal WSFT1 and the second write latch signal WFF2 to generate a second write shifting signal WSFT2. The $N^{th}$ AND gate 246_N may perform a logical AND operation of an (N-1)$^{th}$ write shifting signal WSFTN-1 and the $N^{th}$ write latch signal WFFN to generate the write end signal WEND. The write end signal generation circuit 241 may include the first to $N^{th}$ write shifting latches 245_1 to 245_N and the first to $N^{th}$ AND gates 246_1 to 246_N to perform an operation for shifting the write signal EWT by a period set by the write latency. The number "N" of the first to $N^{th}$ write shifting latches 245_1 to 245_N and the first to $N^{th}$ AND gates 246_1 to 246_N may be set as a natural number which is equal to or greater than two. The write end signal generation circuit 241 may generate the write end signal WEND maintaining an inactivated state from a point in time when the write signal EWT is activated until a point in time when a period set by the write latency elapses from a point in time when the write signal EWT is activated.

Figure 9:
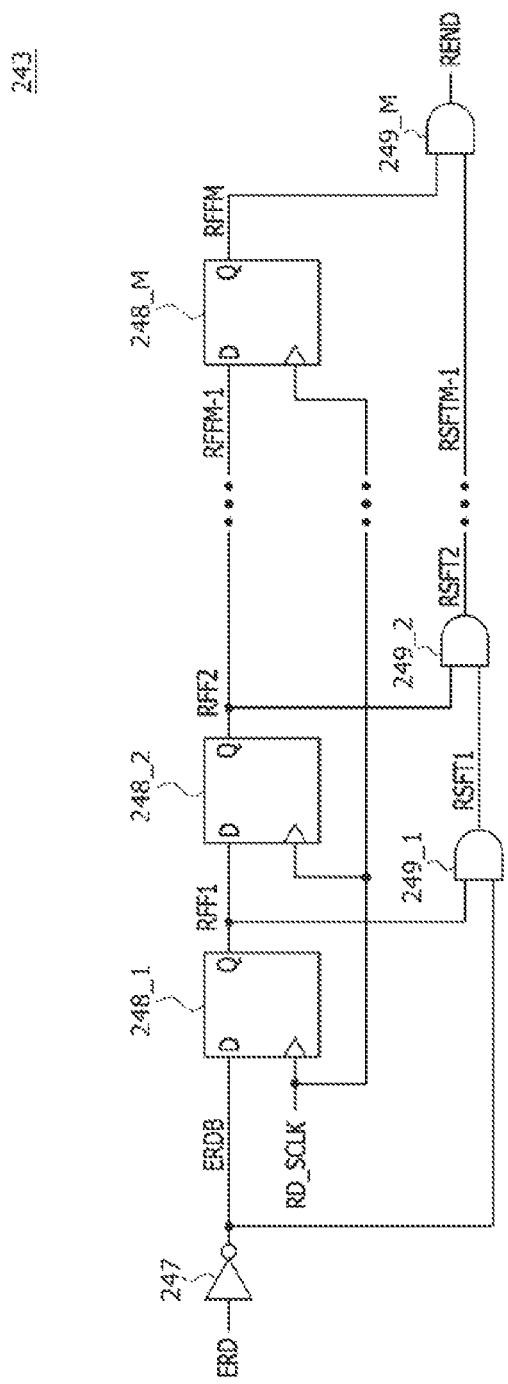
FIG. 9 is a circuit diagram illustrating a read end signal generation circuit included in the latency shifting circuit illustrated in FIG. 7.

FIG. 9 is a circuit diagram illustrating an example of the read end signal generation circuit 243. As illustrated in FIG. 9, the read end signal generation circuit 243 may include an inverter 247, first to $M^{th}$ read shifting latches 248_1 to 248_M, and first to $M^{th}$ AND gates 249_1 to 249_M. The inverter 247 may inversely buffer the read signal ERD to generate an inverted read signal ERDB. The first read shifting latch 248_1 may be synchronized with the read shifting clock RD_SC K to latch the inverted read signal ERDB and may output the latched signal of the inverted read signal ERDB as a first read latch signal RFF1. The second read shifting latch 248_2 may be synchronized with the read shifting clock RD_SCLK to latch the first read latch signal RFF1 and may output the latched signal of the first read latch signal RFF1 as a second read latch signal RFF2. The $M^{th}$ read shifting latch 248_M may be synchronized with the read shifting clock RD_SCLK to latch an M-1$^{th}$ read latch signal RFFM-1 and may output the latched signal of the M-1$^{th}$ read latch signal RFM-1 as an $M^{th}$ read latch signal RFFM. The first AND gate 249_1 may perform a logical AND operation of the inverted read signal ERDB and the first read latch signal RFF1 to generate a first read shifting signal RSFT1. The second AND gate 249_2 may perform a logical AND operation of the first read shifting signal RSFT1 and the second read latch signal RFF2 to generate a second read shifting signal RSFT2. The $M^{th}$ AND gate 249_M may perform a logical AND operation of an (M-1$^{th}$ read shifting signal RSFTM-1 and the $M^{th}$ read latch signal RFFM to generate the read end signal REND. The read end signal generation circuit 243 may include the first to $M^{th}$ read shifting latches 248_1 to 248_M and the first to $M^{th}$ AND gates 249_1 to 249_M to perform an operation for shifting the read signal ERD by a period set by the read latency. The number "M" of the first to $M^{th}$ read shifting latches 248_1 to 248_M and the first to $M^{th}$ AND gates 249_1 to 249_M may be set as a natural number which is equal to or greater than two. The read end signal generation circuit 243 may generate the read end signal REND maintaining an inactivated state from a point in time when the read signal ERD is activated until a point in time when a period set by the read latency elapses from a point in time when the read signal ERD is activated.

Figure 10:
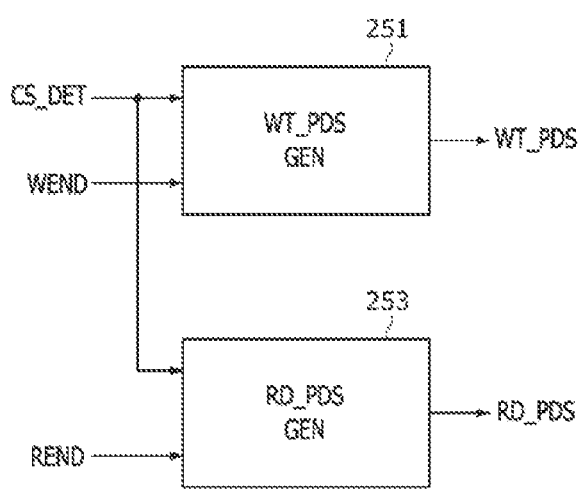
FIG. 10 is a block diagram illustrating a configuration of a period signal generation circuit included in the electronic device illustrated in FIG. 2.

FIG. 10 is a block diagram illustrating a configuration of an example of the period signal generation circuit 213. As illustrated in FIG. 10, the period signal generation circuit 213 may include a write period signal generation circuit 251 and a read period signal generation circuit 253. The write period signal generation circuit 251 may generate a write period signal WT_PDS based on the detection signal CS_DET and the write end signal WEND. The write period signal generation circuit 251 may activate the write period signal WT_PDS when the detection signal CS_DET is activated. The write period signal generation circuit 251 may inactivate the write period signal WT_PDS when the detection signal CS_DET is inactivated and the write end signal WEND is activated. The read period signal generation circuit 253 may generate the read period signal RD_PDS based on the detection signal CS_DET and the read end signal REND. The read period signal generation circuit 253 may activate the read period signal RD_PDS when the detection signal CS_DET is activated. The read period signal generation circuit 253 may inactivate the read period signal RD_PDS when the detection signal CS_DET is inactivated and the read end signal REND is activated.

Figure 11:
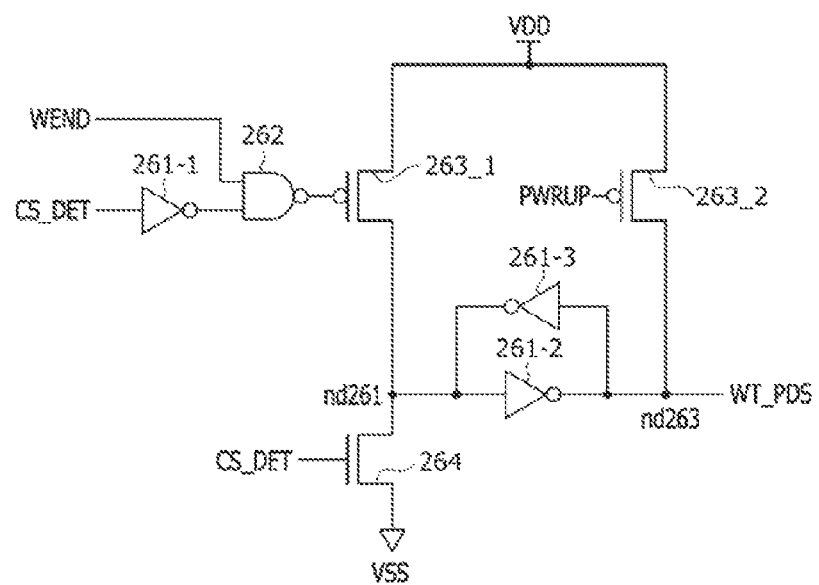
FIG. 11 is a circuit diagram illustrating a write period signal generation circuit included in the period signal generation circuit illustrated in FIG. 10.

FIG. 11 is a circuit diagram illustrating an example of the write period signal generation circuit 251. As illustrated in FIG. 11, the write period signal generation circuit 251 may include inverters 261_1 to 261_3, a NAND gate 262, PMOS transistors 263_1 and 263_2, and an NMOS transistor 264. The inverter 261_1 may inversely buffer the detection signal CS_DET to output the inversely buffered signal of the detection signal CS_DET. The NAND gate 262 may perform a logical NAND operation of the write end signal WEND and an output signal of the inverter 261_1. When the detection signal CS_DET is inactivated to have a logic "low" level and the write end signal WEND is activated to have a logic "high" level, the PMOS transistor 263_1 may be turned on by an output signal of the NAND gate 262, which is generated to have a logic "low" level, to drive a node nd261 to a logic "high" level corresponding to a power supply voltage VDD. The inverters 261_2 and 261_3 may be coupled between the node nd261 and a node nd263 to function as a latch circuit that latches a signal of the node nd261 and a signal of the node nd263. The PMOS transistor 263_2 may be turned on by a power-up signal PWRUP during a power-up period to initialize the node nd263 to a logic "high" level corresponding to the power supply voltage VDD. The power-up signal PWRUP may be set to have a logic "low" level during a power-up period in which the power supply voltage VDD increases from a ground voltage to a predetermined voltage and may be set to have a logic "high" level after the power-up period terminates. When the detection signal CS_DET is activated to have a logic "high" level, the NMOS transistor 264 may be turned on to drive the node nd261 to drive the node nd261 to a logic "low" level corresponding to a ground voltage VSS. In the write period signal generation circuit 251, the write period signal WT_PDS may be activated to have a logic "high" level by the NMOS transistor 264 which is turned on when the detection signal CS_DET is activated to have a logic "high" level. In the write period signal generation circuit 251, the write period signal WT_PDS may be inactivated to have a logic "low" level by the PMOS transistor 263_1 which is turned on when the detection signal CS_DET is inactivated to have a logic "low" level while the write end signal WEND activated to have a logic "high" level is inputted because no write operation is performed. When the detection signal CS_DET is inactivated to have a logic "low" level and the write end signal WEND is activated to a logic "high" level due to termination of the write operation, the write period signal generation circuit 251 may inactivate the write period signal WT_PDS to a logic "low" level. The write period signal WT_PDS may be activated during a relatively longer period when the write operation is performed, as compared with the cases that the active operation, the read operation, and the pre-charge operation are performed.

Figure 12:
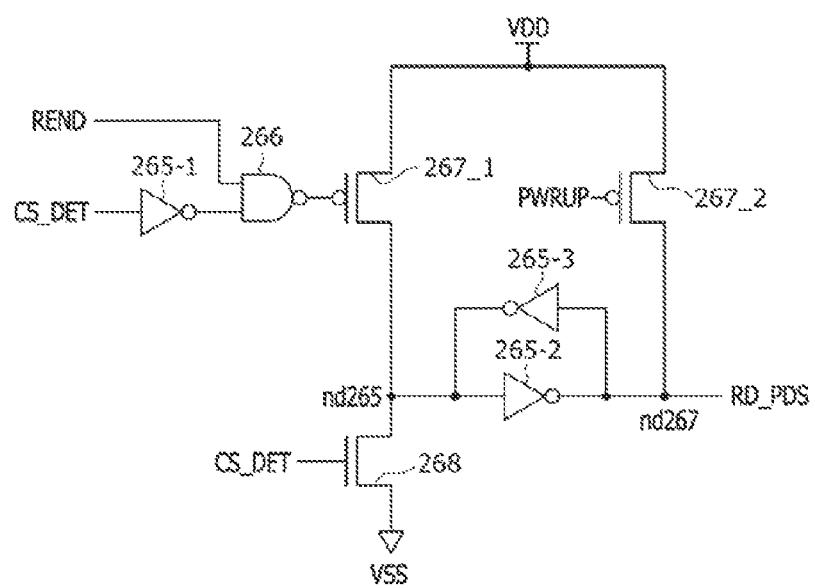
FIG. 12 is a circuit diagram illustrating a read period signal generation circuit included in the period signal generation circuit illustrated in FIG. 10.

FIG. 12 is a circuit diagram illustrating an example of the read period signal generation circuit 253. As illustrated in FIG. 12, the read period signal generation circuit 253 may include inverters 265_1 to 265_3, a NAND gate 266, PMOS transistors 267_1 and 267_2, and an NMOS transistor 268. The inverter 265_1 may inversely buffer the detection signal CS_DET to output the inversely buffered signal of the detection signal CS_DET. The NAND gate 266 may perform a logical NAND operation of the read end signal REND and an output signal of the inverter 265_1, When the detection signal CS_DET is inactivated to have a logic "low" level and the write end signal WEND is activated to have a logic "high" level, the PMOS transistor 267_1 may be turned on by an output signal of the NAND gate 266, which is generated to have a logic "low" level, to drive a node nd265 to a logic "high" level corresponding to the power supply voltage VDD. The inverters 265_2 and 265_3 may be coupled between the node nd265 and a node nd267 to function as a latch circuit that latches a signal of the node nd265 and a signal of the node nd267. The PMOS transistor 267_2 may be turned on by the power-up signal PWRUP during the power-up period to initialize the node nd267 to a logic "high" level corresponding to the power supply voltage VDD, When the detection signal CS_DET is activated to have a logic "high" level, the NMOS transistor 268 may be turned on to drive the node nd265 to a logic "low" level corresponding to the ground voltage VSS. In the read period signal generation circuit 253, the read period signal RD_PDS may be activated to have a logic "high" level by the NMOS transistor 268 that is turned on when the detection signal CS_DET is activated to have a logic "high" level. In the read period signal generation circuit 253, the read period signal RD_PDS may be inactivated to have a logic "low" level by the PMOS transistor 267-1 that is turned on when the detection signal CS_DET is inactivated to have a logic "low" level while the read end signal REND activated to have a logic "high" level is inputted because no read operation is performed. The read period signal generation circuit 253 may inactivate the read period signal RD_PDS to a logic "low" level when the detection signal CS_DET is inactivated to have a logic "low" level and the read end signal REND is activated to a logic "high" level due to termination of the read operation. The read period signal RD_PDS may be activated during a relatively longer period when the read operation is performed, as compared with the cases that the active operation, the read operation, and the pre-charge operation are performed.

Figure 13:
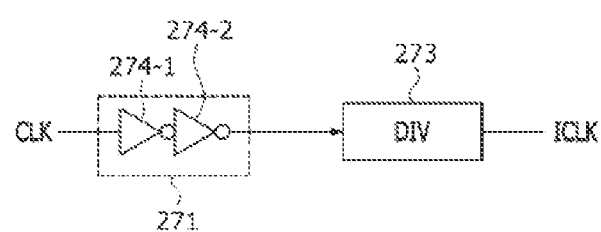
FIG. 13 illustrates a clock buffer circuit included in the electronic device illustrated in FIG. 2.

FIG. 13 illustrates an example of the dock buffer circuit 215. As illustrated in FIG. 13, the dock buffer circuit 215 may include an input buffer 271 and a divider (DIV) 273. The input buffer 271 may include inverters 274_1 and 274_2 and may buffer the dock CLK to output a buffered signal of the dock CLK. The divider 273 may divide an output signal of the input buffer 271 to generate the internal dock ICLK. A cycle of the internal clock ICLK may be set to be equal to "J" (wherein, "J" denotes a natural number which is equal to or greater than two) times a cycle of the clock CLK.

Figure 14:
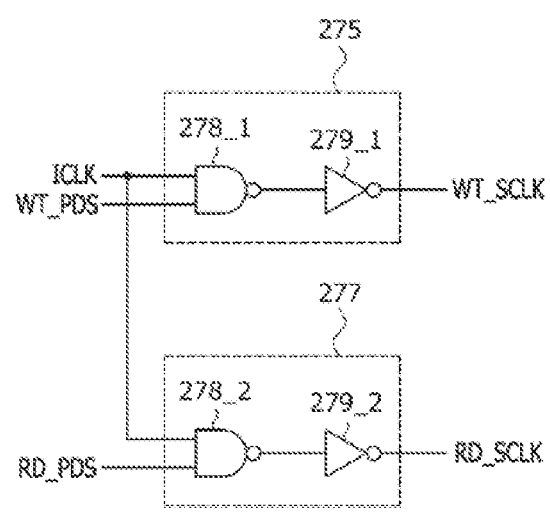
FIG. 14 is a circuit diagram illustrating a shifting clock generation circuit included in the electronic device illustrated in FIG. 2.

FIG. 14 is a circuit diagram illustrating an example of the shifting clock generation circuit 217. As illustrated in FIG. 14, the shifting clock generation circuit 217 may include a write shifting clock generation circuit 275 and a read shifting clock generation circuit 277. The write shifting clock generation circuit 275 may include a NAND gate 278_1 and an inverter 279_1 and may perform a logical AND operation of the internal clock ICLK and the write period signal WT_PDS to generate the write shifting clock WT_SCLK. The write shifting clock generation circuit 275 may buffer the internal clock ICLK to output the buffered signal of the internal clock ICLK as the write shifting clock WT_SCLK while the write period signal WT_PDS is activated. The read shifting clock generation circuit 277 may include a NAND gate 278_2 and an inverter 279_2 and may perform a logical AND operation of the internal clock ICLK and the read period signal RD_PDS to generate the read shifting clock RD_SCLK. The read shifting dock generation circuit 277 may buffer the internal dock ICLK to output the buffered signal of the internal dock ICLK as the read shifting dock RD_SCLK while the read period signal RD_PDS is activated.

Figure 15:
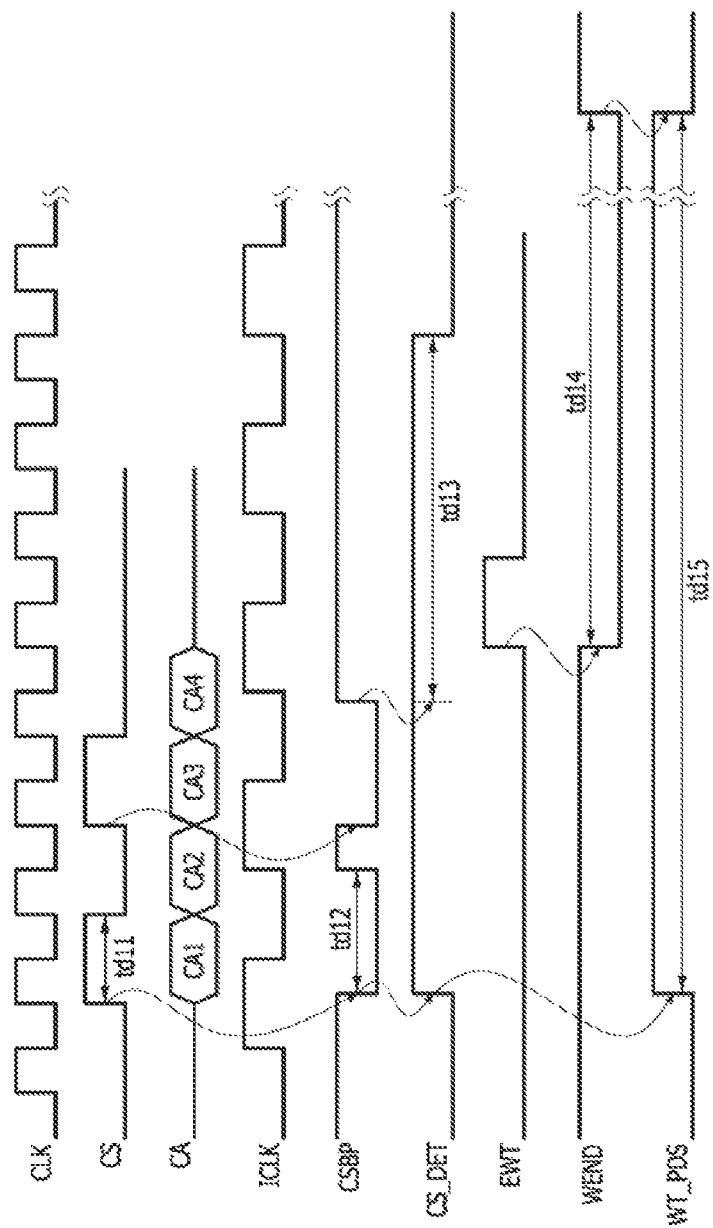
FIGS. 15 and 16 are timing diagrams illustrating an operation of the electronic device illustrated in FIG. 2.
Figure 16:
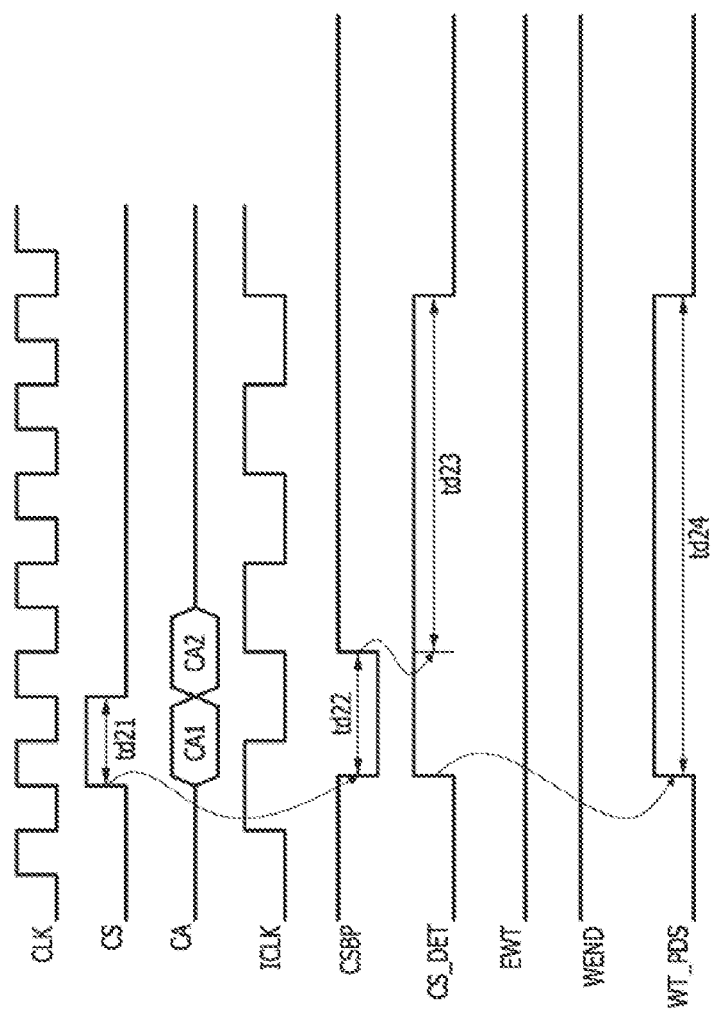

FIGS. 15 and 16 are timing diagrams illustrating an operation of the electronic device 120 illustrated in FIG. 2.

As illustrated in FIG. 15, the write signal EWT may be generated to perform the write operation when the chip selection signal CS and the command CA including first to fourth commands CA1 to CA4 are inputted in synchronization with the dock CLK. The chip selection pulse signal CSBP may be set to have a logic "low" level when the chip selection signal CS is activated from a logic "low" level into a logic "high" level, and a logic level of the chip selection pulse signal CSBP may change from a logic "low" level into a logic "high" level at a point in time when a predetermined period elapses from a point in time when the chip selection signal CS is inactivated from a logic "high" level to a logic "low" level. The chip selection pulse signal CSBP is generated to have a logic "low" level during a period td12 based on the chip selection signal CS which is activated to have a logic "high" level during a period td11. In addition, the chip selection pulse signal CSBP may also be set to have a logic "low" level based on the chip selection signal CS which is activated a second time. The detection signal CS_DET may be activated to have a logic "high" level when the chip selection pulse signal CSBP is generated to have a logic "low" level. The latch dock LCLK for latching the chip selection signal CS and the command CA may be activated from a point in time when the detection signal CS_DET is activated to have a logic "high" level. Accordingly, the latch dock LCLK may be set to be activated after the detection signal CS_DET is activated, thereby reducing unnecessary power consumption. When the chip selection signal CS is repeatedly and sequentially activated in synchronization with the clock CLK, the detection signal CS_DET may maintain an activated state having a logic "high" level during a period from a point in time when a logic level of the chip selection pulse signal CSBP changes from a logic "low" level into a logic "high" level a second time until a point in time when a period td13 elapses from the point in time when a logic level of the chip selection pulse signal CSBP changes from a logic "low" level into a logic "high" level a second time. The write end signal WEND may be inactivated to have a logic "low" level from a point in time when the write signal EWT is generated to have a logic "high" level until a point in time when a period td14 set by the write latency elapses from the point in time when the write signal EWT is generated to have a logic "high" level. When the write end signal WEND is generated, an operation of shifting by a period set by the write latency may be performed based on the shifting clock SCLK and the shifting clock SCLK may be generated when the detection signal CS_DET is activated to have a logic "high" level. Thus, it may be possible to reduce power consumption during the write operation. The write period signal WT_PDS may be activated to have a logic "high" level when the detection signal CS_DET is activated to have a logic "high" level and may be inactivated to have a logic "low" level when the detection signal CS_DET is inactivated to have a logic "low" level and the write end signal WEND is activated to have a logic "high" level. The write period signal WT_PDS may maintain an activated state having a logic "high" level during a period td15.

As illustrated in FIG. 16, the active operation or the pre-charge operation may be performed when the chip selection signal CS and the command CA including first and second commands CA1 and CA2 are inputted in synchronization with the clock CLK. The chip selection pulse signal CSBP may be set to have a logic "low" level when the chip selection signal CS is activated from a logic "low" level into a logic "high" level, and a level of the chip selection pulse signal CSBP may change from a logic "low" level into a logic "high" level at a point in time when a predetermined period elapses from a point in time when the chip selection signal CS is inactivated from a logic "high" level to a logic "low" level. The chip selection pulse signal CSBP may be set to have a logic "low" level during a period td22 based on the chip selection signal CS that is activated to have a logic "high" level during a period td2l. The detection signal CS_DET may be activated to have a logic "high" level when the chip selection pulse signal CSBP is generated to have a logic "low" level. The latch clock LCLK for latching the chip selection signal CS and the command CA may be activated from a point in time when the detection signal CS_DET is activated to have a logic "high" level. When the chip selection signal CS is activated in synchronization with the clock CLK, the detection signal CS_DET may maintain an activated state having a logic "high" level during a period from a point in time when a logic level of the chip selection pulse signal CSBP changes from a logic "low" level into a logic "high" level until a point in time when a period td23 elapses from the point in time when a logic level of the chip selection pulse signal CSBP changes from a logic "low" level into a logic "high" level. The write end signal WEND may maintain an enabled state having a logic "high" level because no write operation is performed. The write period signal WT_PDS may be activated to have a logic "high" level when the detection signal CS_DET is activated to have a logic "high" level and may be inactivated to have a logic "low" level when the detection signal CS_DET is inactivated to have a logic "low" level. The write period signal WT_PDS may maintain an activated state having a logic "high" level for a period td24. The period td24 during which the write period signal WT_PDS is activated to have a logic "high" level when the write operation is not performed may be set to be relatively shorter than the period td15 during which the write period signal WT_PDS is activated to have a logic "high" level when the write operation is performed.

Figure 17:
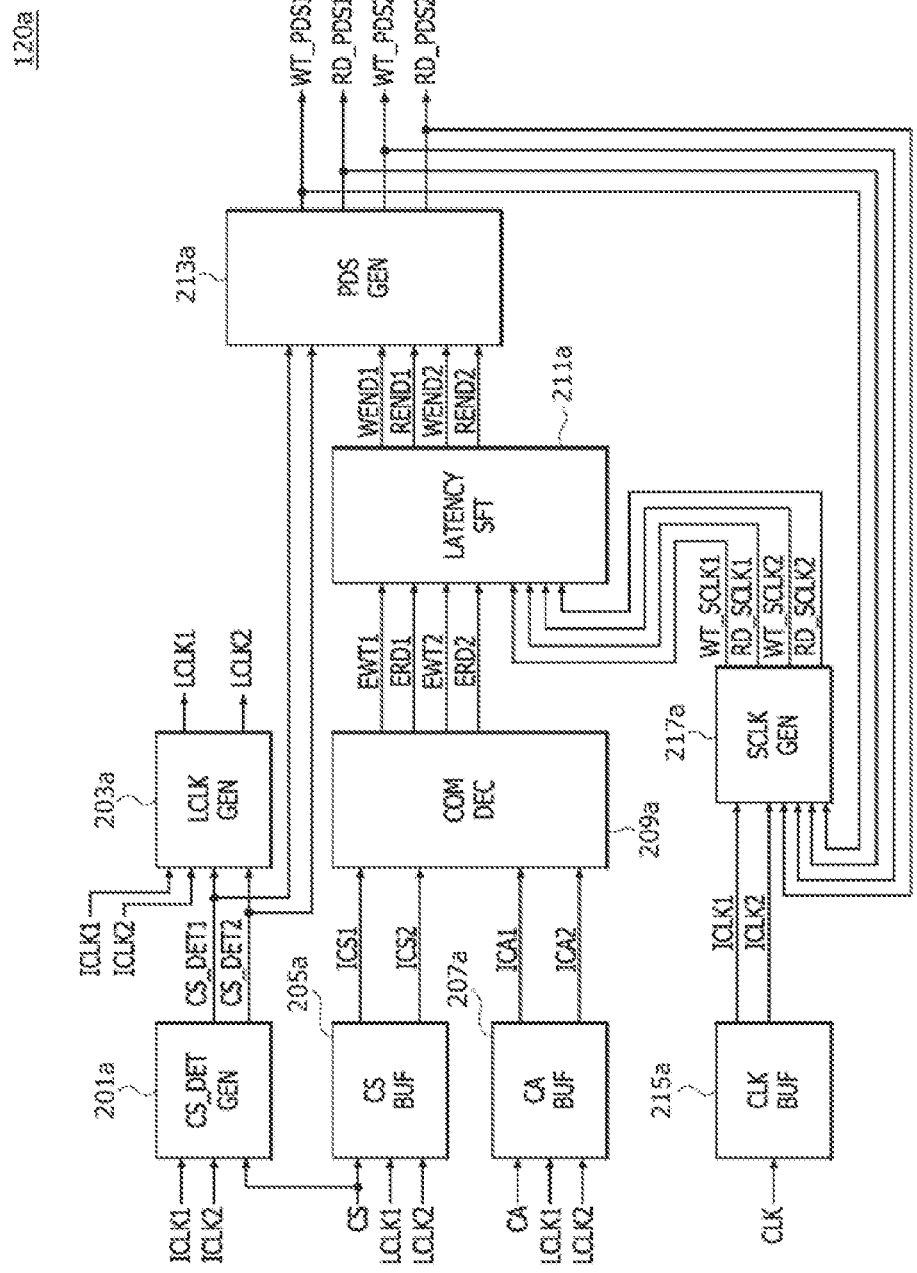
FIG. 17 is a block diagram illustrating a configuration of the electronic device included in the electronic system illustrated in FIG. 1.

FIG. 17 is a block diagram illustrating a configuration of an electronic device 120a corresponding to another example of the electronic device 120 included in the electronic system 100 illustrated in FIG. 1. As illustrated in FIG. 17, the electronic device 120a may include a detection signal generation circuit (CS_DET GEN) 201a, a latch clock generation circuit (LCLK GEN) 203a, a chip selection signal buffer circuit (CS BUF) 205a, a command buffer circuit (CA BUF) 207a, a command decoder (COM DEC) 209a, a latency shifting circuit (LATENCY SFT) 211a, a period signal generation circuit (PDS GEN) 213a, a clock buffer circuit (CLK BUF) 215a, and a shifting clock generation circuit (SCLK GEN) 217a.

The detection signal generation circuit 201a may generate a first detection signal CS_DET1 and a second detection signal CS_DET2 based on a first internal clock ICLK1, a second internal clock ICLK2, and a chip selection signal CS. The detection signal generation circuit 201a may activate the first detection signal CS_DET1 and the second detection signal CS_DET2 when the chip selection signal CS is activated. When the chip selection signal CS is inactivated after being activated, the detection signal generation circuit 201a may inactivate the first detection signal CS_DET1 at a point in time when the predetermined number of cycles of the first internal clock ICLK1 elapses from a point in time when the chip selection signal CS is inactivated. For example, the first detection signal CS_DET1 may be inactivated at a point in time when two cycles of the first internal clock ICLK1 elapse from a point in time when the chip selection signal CS is inactivated. When the chip selection signal CS is inactivated after being activated, the detection signal generation circuit 201a may inactivate the second detection signal CS_DET2 at a point in time when the predetermined number of cycles of the second internal clock ICLK2 elapses from a point in time when the chip selection signal CS is inactivated. For example, the second detection signal CS_DET2 may be inactivated at a point in time when two cycles of the second internal clock ICLK2 elapse from a point in time when the chip selection signal CS is inactivated.

The latch clock generation circuit 203a may generate a first latch clock LCLK1 and a second latch clock LCLK2 based on the first detection signal CS_DET1, the second detection signal CS_DET2, the first internal clock ICLK1, and the second internal clock ICLK2. The latch clock generation circuit 203a may buffer the first internal clock ICLK1 to output the buffered signal of the first internal clock ICLK1 as the first latch clock LCLK1 when the first detection signal CS_DET1 is activated. The latch clock generation circuit 203a may activate the first latch clock LCLK1 while the first detection signal CS_DET1 is activated. The latch clock generation circuit 203a may buffer the second internal clock ICLK2 to output the buffered signal of the second internal clock ICLK2 as the second latch clock LCLK2 when the second detection signal CS_DET2 is activated. The latch clock generation circuit 203a may activate the second latch clock ICLK2 while the second detection signal CS_DET2 is activated.

The chip selection signal buffer circuit 205a may generate a first internal chip selection signal ICS1 and a second internal chip selection signal ICS2 based on the first latch clock LCLK1, the second latch clock LCLK2, and the chip selection signal CS. When the first latch dock LCLK1 is activated, the chip selection signal buffer circuit 205a may latch the chip selection signal CS to output the latched signal of the chip selection signal CS as the first internal chip selection signal ICS1. When the second latch clock LCLK2 is activated, the chip selection signal buffer circuit 205a may latch the chip selection signal CS to output the latched signal of the chip selection signal CS as the second internal chip selection signal ICS2. The chip selection signal buffer circuit 205a might latch the chip selection signal CS only when the first latch clock LCLK1 and the second latch clock LCLK2 are activated, thereby reducing power consumption.

The command buffer circuit 207a may generate a first internal command ICA1 and a second internal command ICA2 based on the first latch clock LCLK1, the second latch clock LCLK2, and a command CA. When the first latch clock LCLK1 is activated, the command buffer circuit 207a may latch the command CA to output the latched signal of the command CA as the first internal command ICA1. When the second latch clock LCLK2 is activated, the command buffer circuit 207a may latch the command CA to output the latched signal of the command CA as the second internal command ICA2. The command buffer circuit 207a might latch the command CA only when the first latch dock LCLK1 and the second latch clock LCLK2 are activated, thereby reducing power consumption.

The command decoder 209a may generate internal operation signals based on the first internal chip selection signal ICS1, the second internal chip selection signal ICS2, the first internal command ICA1, and the second internal command ICA2. The internal operation signals may include a first write signal EWT1, a second write signal EWT2, a first read signal ERD1, and a second read signal ERD2. The command decoder 209a may generate the first write signal EWT1 and the first read signal ERDI by decoding the first internal command ICA1 based on the first internal chip selection signal ICS1. The command decoder 209a may activate the first write signal EWT1 and the first read signal ERD1 by decoding the first internal command ICA1 sequentially inputted based on the first internal chip selection signal ICS1. For example, the first write signal EWT1 may be activated when the first internal command ICA1 having a first logic level combination is inputted based on the first internal chip selection signal ICS1, and the first read signal ERD1 may be activated when the first internal command ICA1 having a second logic level combination is inputted based on the first internal chip selection signal ICS1. The command decoder 209a may generate the second write signal EWT2 and the second read signal ERD2 by decoding the second internal command ICA2 based on the second internal chip selection signal ICS2. The command decoder 209a may activate the second write signal EWT2 and the second read signal ERD2 by decoding the second internal command ICA2 sequentially inputted based on the second internal chip selection signal ICS2. The first write signal EWT1 and the second write signal EWT2 may be activated to perform a write operation. The first read signal ERD1 and the second read signal ERD2 may be activated to perform a read operation.

The latency shifting circuit 211a may generate end signals based on the first write signal EWT1, the second write signal EWT2, the first read signal ERD1, the second read signal ERD2, a first write shifting clock WT_SCLK1, a second write shifting clock WT_SCLK2, a first read shifting clock RD_SCLK1, and a second read shifting clock RD_SCLK2. The end signals may include a first write end signal WEND1, a second write end signal WEND2, a first read end signal REND1, and a second read end signal REND2. The latency shifting circuit 211a may generate the first write end signal WEND1 that maintains an inactivated state from a point in time when the first write signal EWT1 is activated until a point in time when a period set by a write latency elapses from a point in time when the first write signal EWT1 is activated. The first write end signal WEND1 may be activated while the write operation is not performed. The first write end signal WEND1 may maintain an inactivated state during a period set by the write latency through a shifting operation performed based on the first write shifting clock WT_SCLK1. The latency shifting circuit 211a may generate the second write end signal WEND2 that maintains an inactivated state from a point in time when the second write signal EWT2 is activated until a point in time when a period set by the write latency elapses from a point in time when the second write signal EWT2 is activated. The second write end signal WEND2 may be activated while the write operation is not performed. The second write end signal WEND2 may maintain an inactivated state during a period set by the write latency through a shifting operation performed based on the second write shifting clock WT_SCLK2. The latency shifting circuit 211a may generate the first read end signal REND1 that maintains an inactivated state from a point in time when the first read signal ERD1 is activated until a point in time when a period set by a read latency based on the first read shifting clock RD_SCLK1 elapses from a point in time when the first read signal ERD1 is activated. The first read end signal REND1 may be activated while the read operation is not performed. The first read end signal REND1 may maintain an inactivated state during a period set by the read latency through a shifting operation performed based on the first read shifting clock RD_SCLK1. The latency shifting circuit 211a may generate the second read end signal REND2 that maintains an inactivated state from a point in time when the second read signal ERD2 is activated until a point in time when a period set by the read latency based on the second read shifting dock RD_SCLK2 elapses from a point in time when the second read signal ERD2 is activated. The second read end signal REND2 may be activated while the read operation is not performed. The second read end signal REND2 may maintain an inactivated state during a period set by the read latency through a shifting operation performed based on the second read shifting dock RD_SCLK2.

The period signal generation circuit 213a may generate period signals based on the first detection signal CS_DET1, the second detection signal CS_DET2, the first write end signal WEND1, the second write end signal WEND2, the first read end signal REND1, and the second read end signal REND2. The period signals may include a first write period signal WT_PDS1, a second write period signal WT_PDS2, a first read period signal RD_PDS1, and a second read period signal RD_PDS2. The period signal generation circuit 213a may activate the first write period signal WT_PDS1 and the first read period signal RD PDS1 when the first detection signal CS_DET1 is activated. The period signal generation circuit 213a may inactivate the first write period signal WT_PDS1 when the first detection signal CS_DET1 is inactivated and the first write end signal WEND1 is activated. The first write period signal WT_PDS1 may be set to be activated during a relatively longer period when the write operation is performed, as compared with cases that the active operation, the read operation, and the pre-charge operation are performed. The period signal generation circuit 213a may inactivate the first read period signal RD PDS1 when the first detection signal CS_DET1 is inactivated and the first read end signal REND1 is activated. The first read period signal RD_PDS1 may be set to be activated during a relatively longer period when the read operation is performed, as compared with cases that the active operation, the write operation, and the pre-charge operation are performed. The period signal generation circuit 213a may activate the second write period signal WT_PDS2 and the second read period signal RD_PDS2 when the second detection signal CS_DET2 is activated. The period signal generation circuit 213a may inactivate the second write period signal WT_PDS2 when the second detection signal CS_DET2 is inactivated and the second write end signal WEND2 is activated. The second write period signal WT_PDS2 may be set to be activated during a relatively longer period when the write operation is performed, as compared with cases that the active operation, the read operation, and the pre-charge operation are performed. The period signal generation circuit 213a may inactivate the second read period signal RD_PDS2 when the second detection signal CS_DET2 is inactivated and the second read end signal REND2 is activated. The second read period signal RD_PDS2 may be set to be activated during a relatively longer period when the read operation is performed, as compared with cases that the active operation, the write operation, and the pre-charge operation are performed.

The dock buffer circuit 215a may generate the first internal clock ICLK1 and the second internal clock ICLK2 based on a dock CLK. The clock buffer circuit 215a may generate the first internal clock ICLK1 and the second internal dock ICLK2 by dividing the dock CLK. A cycle of each of the first and second internal clocks ICLK1 and ICLK2 may be set to be equal to "I" (wherein, "I" denotes a natural number which is equal to or greater than two) times a cycle of the dock CLK. A level transition of the first internal clock ICLK1 may occur in synchronization with a rising edge of the clock CLK, a level transition of the second internal clock ICLK2 may occur in synchronization with a falling edge of the clock CLK.

The shifting clock generation circuit 217a may generate shifting clocks based on the first internal clock ICLK1, the second internal clock ICLK2, the first write period signal WT_PDS1, the second write period signal WT_PDS2, the first read period signal RD_PDS1, and the second read period signal RD_PDS2. The shifting clocks may include the first write shifting clock WT_SCLK1, the second write shifting clock WT_SCLK2, the first read shifting clock RD_SCLK1, and the second read shifting clock RD_SCLK2. The shifting clock generation circuit 217a may buffer the first internal clock ICLK1 to output the buffered signal of the first internal clock ICLK1 as the first write shifting clock WT_SCLK1 while the first write period signal WT_PDS1 is activated. The shifting clock generation circuit 217a may buffer the second internal clock ICLK2 to output the buffered signal of the second internal dock ICLK2 as the second write shifting clock WT_SCLK2 while the second write period signal WT_PDS2 is activated. The shifting dock generation circuit 217a may buffer the first internal clock ICLK1 to output the buffered signal of the first internal clock ICLK1 as the first read shifting clock RD_SCLK1 while the first read period signal RD PDS1 is activated. The shifting clock generation circuit 217a may buffer the second internal clock ICLK2 to output the buffered signal of the second internal clock ICLK2 as the second read shifting clock RD_SCLK2 while the second read period signal RD_PDS2 is activated.

Figure 18:
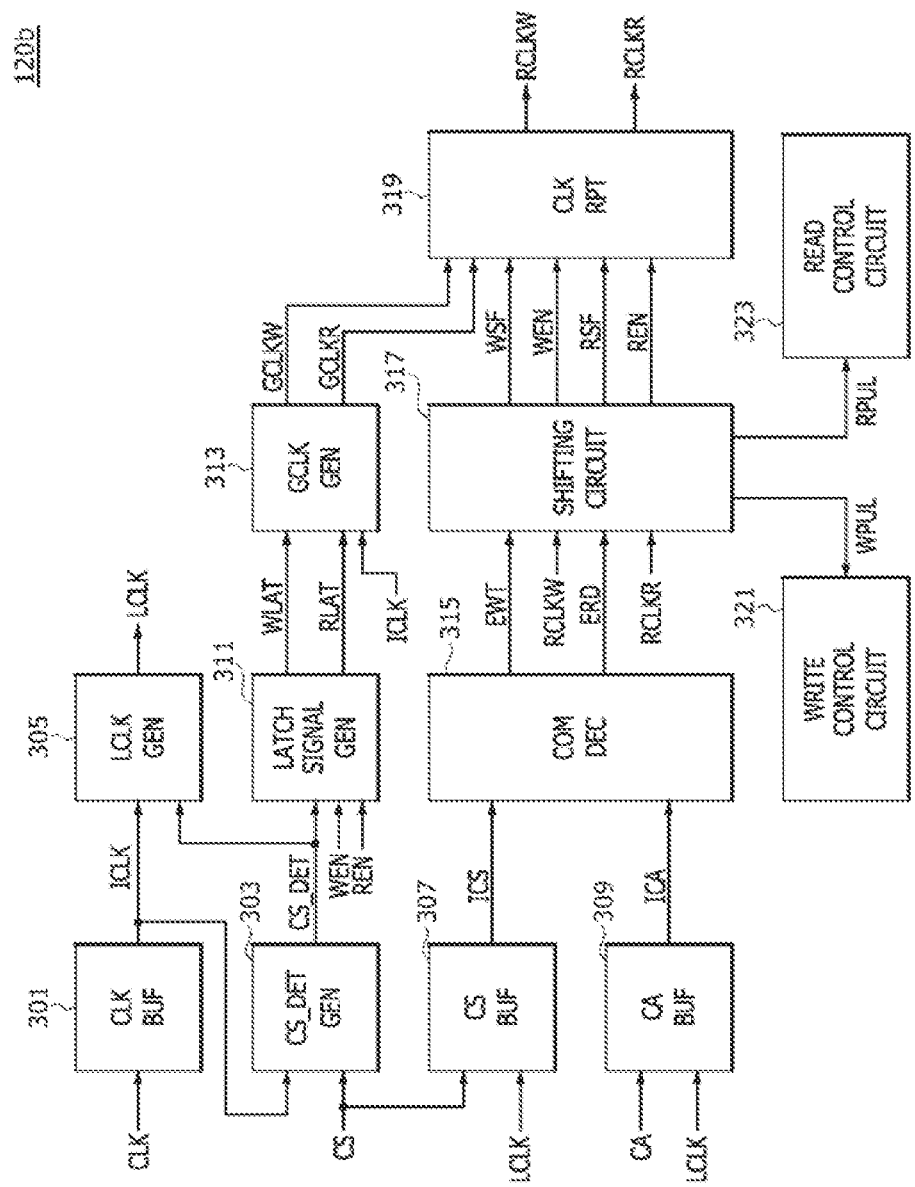
FIG. 18 is a block diagram illustrating a configuration of the electronic device included in the electronic system illustrated in FIG. 1.

FIG. 18 is a block diagram illustrating a configuration of an electronic device 120b according to another embodiment of the electronic device 120 illustrated in FIG. 1. As illustrated in FIG. 18, the electronic device 120b may include a clock buffer circuit (CLK BUF) 301, a detection signal generation circuit (CS_DET GEN) 303, a latch clock generation circuit (LCLK GEN) 305, a chip selection signal buffer circuit (CS BUF) 307, a command buffer circuit (CA BUF) 309, a latch signal generation circuit (LATCH SIGNAL GEN) 311, a gating clock generation circuit (GCLK GEN) 313, a command decoder (COM DEC) 315, a shifting circuit 317, a clock repeater (CLK RPT) 319, a write control circuit 321, and a read control circuit 323.

The clock buffer circuit 301 may generate an internal clock ICLK based on a clock CLK. The clock buffer circuit 301 may buffer the clock CLK to generate the internal clock ICLK. According to an embodiment, the dock buffer circuit 301 may generate the internal clock ICLK by dividing the dock CLK.

The detection signal generation circuit 303 may generate a detection signal CS_DET based on the internal dock ICLK and a chip selection signal CS. The detection signal generation circuit 303 may activate the detection signal CS_DET when the chip selection signal CS is activated. The detection signal generation circuit 303 may generate the detection signal CS_DET that maintains an activated state for a preset period from a time when the chip selection signal CS is activated. The logic level and period in which the detection signal CS_DET is activated may be variously set according to embodiments.

The latch clock generation circuit 305 may generate a latch clock LCLK based on the detection signal CS_DET and the internal clock ICLK. The latch clock generation circuit 305 may buffer the internal clock ICLK to output the buffered internal clock as the latch clock LCLK when the detection signal CS_DET is activated. The latch clock generation circuit 305 may activate the latch clock LCLK during a period in which the detection CS_DET is activated.

The chip selection signal buffer circuit 307 may generate an internal chip selection signal ICS based on the latch clock LCLK and the chip signal CS. The chip selection signal buffer circuit 307 may latch the chip selection signal CS to output the latched signal of the chip selection signal CS as the internal chip selection signal ICS when the latch clock LCLK is activated. The chip selection signal buffer circuit 307 might latch the chip selection signal CS only when the latch clock LCLK is activated, thereby reducing power consumption.

The command buffer circuit 309 may generate an internal command ICA based on the latch clock LCLK and a command CA. The command buffer circuit 309 may latch the command CA to output the latched command as the internal command ICA when the latch clock LCLK is activated. The command buffer circuit 309 might latch the command CA only when the latch clock LCLK is activated, thereby reducing power consumption.

The latch signal generation circuit 311 may receive the detection signal CS_DET from the detection signal generation circuit 303. The latch signal generation circuit 311 may receive a write enable signal WEN and a read enable signal REN from the shifting circuit 317. The latch signal generation circuit 311 may generate a write latch signal WLAT and a read latch signal RLAT based on the detection signal CS_DET, the write enable signal WEN, and the read enable signal REN. The latch signal generation circuit 311 may generate the write latch signal WLAT and the read latch signal RLAT that are both activated when the detection signal CS_DET is activated to perform a write operation or a read operation. The latch signal generation circuit 311 may generate the write latch signal WLAT that is inactivated when the detection signal CS_DET is inactivated while the write operation is performed and the write enable signal WEN is activated. The latch signal generation circuit 311 may generate the read latch signal RLAT that is inactivated when the detection signal CS_DET is inactivated while the read operation is performed and the read enable signal REN is activated.

The gating clock generation circuit 313 may receive the internal clock ICLK from the clock buffer circuit 301. The gating clock generation circuit 313 may receive the write latch signal WLAT and the read latch signal RLAT from the latch signal generation circuit 311. The gating clock generation circuit 313 may generate a write gating clock GCLKW and a read gating clock GCLKR from the write latch signal WLAT, the read latch signal RLAT, and the internal clock ICLK. The gating clock generation circuit 313 may generate the write gating clock GCLKW from the internal clock ICLK based on the write latch signal WLAT. The gating clock generation circuit 313 may buffer the internal clock ICLK to output the buffered signal of the internal clock ICLK as the write gating clock GCLKW when the write latch signal WLAT is activated. The gating clock generation circuit 313 may generate the read gating clock GCLKR from the internal clock ICLK based on the read latch signal RLAT. The gating clock generation circuit 313 may buffer the internal clock ICLK to output the buffered signal of the internal clock ICLK as the read gating clock GCLKR when the read latch signal RLAT is activated.

The command decoder 315 may generate an internal operation signal based on the internal chip selection signal ICS and the internal command ICA. The internal operation signal may include a write signal EWT and a read signal ERD. The command decoder 315 may generate the write signal EWT and the read signal ERD by decoding the internal command ICA according to the internal chip selection signal ICS. The command decoder 315 may activate the write signal EWT and the read signal ERD by decoding the internal command ICA sequentially input based on the internal chip selection signal ICS. The write signal EWT may be activated for a write operation. The read signal ERD may be activated for a read operation.

The shifting circuit 317 may receive the write signal EWT and the read signal ERD from the command decoder 315. The shifting circuit 317 may receive a write repeating clock RCLKW and a read repeating clock RCLKR from the clock repeater 319. The shifting circuit 317 may generate a write shifting flag WSF, the write enable signal WEN, a write pulse WPUL, a read shifting flag RSF, the read enable signal REN, and a read pulse RPUL based on the write signal EWT, the read signal ERD, the write repeating clock RCLKW, and the read repeating clock RCLKR.

The shifting circuit 317 may inactivate the write shifting flag WSF and may activate the write enable signal WEN when the write signal EWT is activated, Before the write signal EWT is activated, the write shifting flag WSF may be initialized to an activated state and the write enable signal WEN may be initialized to an inactivated state. The logic level to which each of the write shifting flag WSF and the write enable signal WEN is initialized and the logic level at which each of the write shifting flag WSF and the write enable signal WEN is activated may be set in various ways according to embodiments. The shifting circuit 317 may generate the write shifting flag WSF that maintains an inactivated state for as long as a write flag period set by the write repeating clock RCLKW when the write signal EWT is activated. The shifting circuit 317 may activate the write enable signal WEN that maintains an inactivated state for as long as a write enable period set by the write repeating clock RCLKW when the write signal EWT is activated. The shifting circuit 317 may generate the write pulse WPUL that is activated when the write signal EWT is activated and the write shifting period has elapsed in synchronization with the write repeating clock RCLKW. The logic level at which the write pulse WPUL is activated may be variously set according to embodiments. In the present embodiment, the write shifting period may be set larger than the write enable period, and the write enable period may be set larger than the write flag period.

The shifting circuit 317 may inactivate the read shifting flag RSF and may activate the read enable signal REN when the read signal ERD is activated. Before the read signal ERD is activated, the read shifting flag RSF may be initialized to have an activated state and the read enable signal REN may be initialized to have an inactivated state. The logic level to which each of the read shifting flag RSF and the read enable signal REN is initialized and the logic level at which each of the read shifting flag RSF and the read enable signal REN is activated may be variously set according to embodiments. The shifting circuit 317 may generate the read shifting flag RSF that maintains an inactivated state for as long as a read flag period set by the read repeating clock RCLKR when the read signal ERD is activated. The shifting circuit 317 may activate the read enable signal REN that maintains an activated state for as long as a read enable period set by the read repeating clock RCLKR when the read signal ERD is activated. The shifting circuit 317 may generate the read pulse RPUL that is activated when the read shifting period elapses in synchronization with the read repeating clock RCLKR from a time when the read signal ERD is activated. The logic level at which the read pulse RPUL is activated may be variously set according to embodiments. In the present embodiment, the read shifting period may be set larger than the read enable period, and the read enable period may be set larger than the read flag period.

The clock repeater 319 may receive the write gating clock GCLKW and the read gating clock GCLKR from the gating clock generation circuit 313. The clock repeater 319 may receive the write shifting flag WSF, the write enable signal WEN, the read shifting flag RSF, and the read enable signal REN from the shifting circuit 317. The clock repeater 319 may generate the write repeating dock RCLKW and the read repeating dock RCLKR from the write gating dock GCLKW and the read gating clock GCLKR based on the write shifting flag WSF, the write enable signal WEN, the read shifting flag RSF, and the read enable signal REN.

The dock repeater 319 may generate the write repeating clock RCLKW from the write gating dock GCLKW based on the read shifting flag RSF and the write enable signal WEN. The dock repeater 319 may buffer the write gating dock GCLKW to generate the write repeating dock RCLKW when the read shifting flag RSF initialized to an activated state and the write enable signal WEN initialized to an inactivated state are input before the write signal WEN or the read signal ERD is activated. The clock repeater 319 may buffer the write gating dock GCLKW by the write enable signal WEN that is activated when a write operation is performed and the write signal EWT is activated to generate the write repeating clock RCLKW. The clock repeater 319 may block an operation of generating the write repeating clock RCLKW from the write gating clock GCLKW when the read shifting flag RSF whose logic level is changed into an inactivated state by the read signal ERD activated by performing a read operation is received. The electronic device 120b according to the present embodiment blocks the operation of generating the write repeating clock RCLKW during the read flag period in which the read operation is performed and the read shifting flag RSF maintains the inactivated state, thereby preventing power consumption in generating unnecessary clocks in the read operation.

The clock repeater 319 may generate the read repeating clock RCLKR from the read gating clock GCLKR based on the write shifting flag WSF and the read enable signal REN. The clock repeater 319 may buffer the read gating clock GCLKR to generate the read repeating clock RCLKR when the write shifting flag WSF initialized to an activated state and the read gating clock GCLKR initialized to an inactivated state are input before the write signal EWT or the read signal ERD is activated. The clock repeater 319 may buffer the read gating clock GCLKR by the read enable signal REN that is activated when the read operation is performed and the read signal ERD is activated to generate the read repeating clock RCLKR. The clock repeater 319 may block an operation of generating the read repeating clock RCLKR from the read gating clock GCLKR when the write shifting flag WSF that is transitioned to an inactivated state by the write signal EWT activated by the write operation is received. The electronic device 120b according to the present embodiment blocks the operation of generating the read repeating clock RCLKR during the write flag period in which the write operation is performed and the write shifting flag WSF maintains an inactivated state, thereby preventing power consumption in generating unnecessary clocks in the write operation.

The write control circuit 321 may receive the write pulse WPUL from the shifting circuit 317. The write control circuit 321 may control an operation in which data is input in the write operation when the write pulse WPUL is activated.

The read control circuit 323 may receive the read pulse RPUL from the shifting circuit 317. The read control circuit 323 may control an operation in which data is output in the read operation when the read pulse RPUL is activated.

Figure 19:
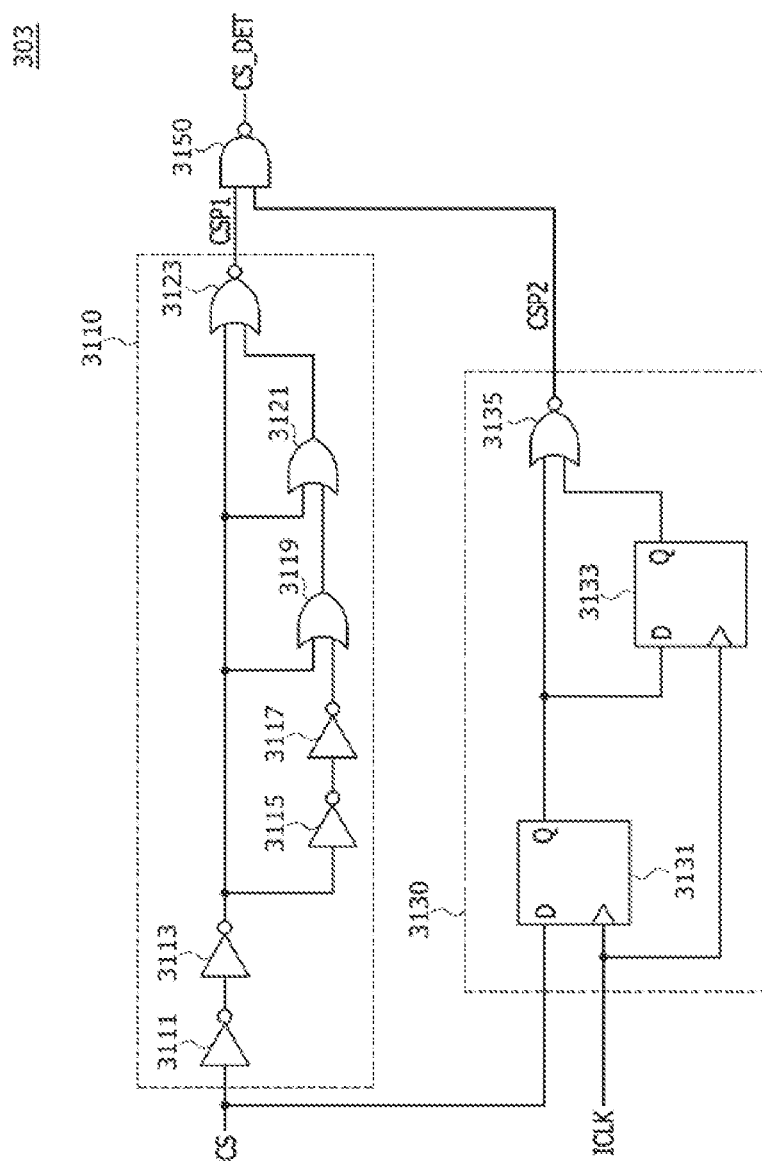
FIG. 19 is a circuit diagram illustrating a detection signal generation circuit included in the electronic device illustrated in FIG. 18.

FIG. 19 is a circuit diagram, according to an embodiment, of the detection signal generation circuit 303 of FIG. 18. As illustrated in FIG. 19, the detection signal generation circuit 303 may include a first chip selection pulse generation circuit 3110, a second chip selection pulse generation circuit 3130, and a detection signal output circuit 3150.

The first chip selection pulse generation circuit 3110 may include inverters 3111, 3113, 3115, and 3117; OR gates 3119 and 3121; and a NOR gate 3123. The inverter 3111 may inversely buffer the chip selection signal CS. The inverter 3113 may inversely buffer an output signal of the inverter 3111. The inverter 3115 may inversely buffer an output signal of the inverter 3113. The inverter 3117 may inversely buffer an output signal of the inverter 3115. The OR gate 3119 may receive the output signal of the inverter 3113 and an output signal of the inverter 3117 to perform a logical OR operation. The OR gate 3121 may receive the output signal of the inverter 3113 and an output signal of the OR gate 3119 to perform a logical OR operation. The NOR gate 3123 may receive the output signal of the inverter 3113 and an output signal of the OR gate 3121 and perform a logical NOR operation to generate a first chip selection pulse CSP1. The first chip selection pulse generation circuit 3110 may generate the first chip selection pulse CSP1 having a logic "low" level when the chip selection signal CS is activated so that a logic level of the chip selection signal CS changes from a logic "low" level into a logic "high" level. The first chip selection pulse generation circuit 3110 may change a logic level of the first chip selection pulse CSP1 from a logic "low" level into a logic "high" level when a period set by the inverters 3111 to 3117, the OR gates 3119 and 3121, and the NOR gate 3123 elapses from a time when the chip selection signal CS is inactivated so that a logic level of the chip selection signal CS changes from a logic "high" level into a logic "low" level.

The second chip selection pulse generation circuit 3130 may include chip selection signal latches 3131 and 3133, and a NOR gate 3135. The chip selection signal latch 3131 may latch the chip selection signal CS in synchronization with the internal clock ICLK to output the latched signal of the chip selection signal CS. The chip selection signal latch 3133 may latch an output signal of the chip selection signal latch 3131 in synchronization with the internal clock ICLK to output the latched signal of the output signal of the chip selection signal latch 3131. The NOR gate 3135 may receive the output signal of the chip selection signal latch 3131 and an output signal of the chip selection signal latch 3133 and may perform a logical NOR operation to generate a second chip selection pulse CSP2, The second chip selection pulse generation circuit 3130 may generate the second chip selection pulse CSP2 having a logic "low" level when the chip selection signal CS is activated so that a logic level of the chip selection signal CS changes from a logic "low" level into a logic "high" level. The second chip selection pulse generation circuit 3130 may change a logic level of the second chip selection pulse CSP2 from a logic "low" level into a logic "high" level at a time point when the chip selection signal CS is activated and a period set by the chip selection signal latches 3131 and 3133 elapses.

The detection signal output circuit 3150 may include a NAND gate. The detection signal output circuit 3150 may receive the first chip selection pulse CSP1 and the second chip selection pulse CSP2 and may perform a logical NAND operation to generate a detection signal CS_DET. The detection signal output circuit 3150 may generate the detection signal CS_DET that is activated to a logic "high" level during a period in which the first chip selection pulse CSP1 is generated to have a logic "low" level or a period in which the second chip selection pulse CSP2 is generated to have a logic "low" level. The detection signal output circuit 3150 may generate the detection signal CS_DET that is activated to a logic "high" level when the first chip selection pulse CSP1 is set to have a logic "low" level or the second chip selection pulse CSP2 is set to have a logic "low" level. The detection signal output circuit 3150 may generate the detection signal CS_DET that is activated to a logic "high" level during a preset period set by the first chip selection pulse CSP1 and the second chip selection pulse CSP2 from a time point when the chip selection signal CS is activated.

Figure 20:
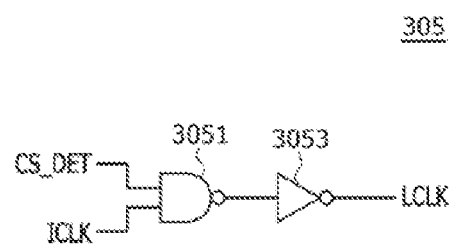
FIG. 20 is a circuit diagram illustrating a latch dock generation circuit included in the electronic device illustrated in FIG. 18.

FIG. 20 is a circuit diagram, according to an embodiment, of the latch dock generation circuit 305 of FIG. 18, As illustrated in FIG. 20, the latch dock generation circuit 305 may include a NAND gate 3051 and an inverter 3053. The NAND gate 3051 may receive the detection signal CS_DET and the internal clock ICLK to perform a logical NAND operation. The inverter 3053 may inversely buffer an output signal of the NAND gate 3051 to generate a latch clock LCLK. The latch clock generation circuit 305 may buffer the internal clock ICLK to output the buffered signal of the internal clock ICLK as the latch clock LCLK when the detection signal CS_DET is activated to a logic "high" level.

Figure 21:
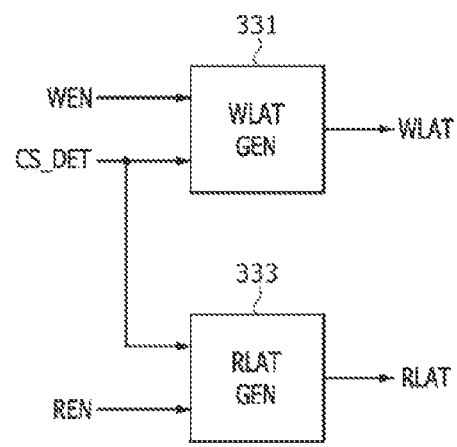
FIG. 21 is a block diagram illustrating a latch signal generation circuit included in the electronic device illustrated in FIG. 18.

FIG. 21 is a block diagram a configuration, according to an embodiment, of the latch signal generation circuit 311 of FIG. 18. As illustrated in FIG. 21, the latch signal generation circuit 311 may include a write latch signal generation circuit 331 and a read latch signal generation circuit 333.

The write latch signal generation circuit 331 may generate the write latch signal WLAT based on the detection signal CS_DET and the write enable signal WEN. The write latch signal generation circuit 331 may generate the write latch signal WLAT that is activated when the detection signal CS_DET is activated to perform a write operation. The latch signal generation circuit 331 may generate the write latch signal WLAT that is inactivated when the detection signal CS_DET is inactivated while a write operation is performed and the write enable signal WEN is activated.

The read latch signal generation circuit 333 may generate the read latch signal RLAT based on the detection signal CS_DET and the read enable signal REN. The read latch signal generation circuit 333 may generate the read latch signal RLAT that is activated when the detection signal CS_DET is activated to perform a read operation. The read latch signal generation circuit 333 may generate the read latch signal RLAT that is inactivated when the detection signal is inactivated while a read operation is performed and the read enable signal REN is activated.

Figure 22:
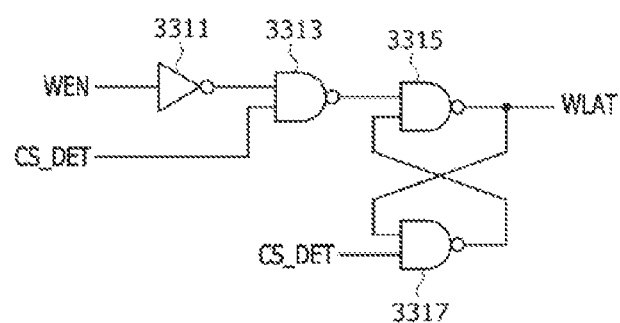
FIG. 22 is a circuit diagram illustrating a write latch signal generation circuit included in the latch signal generation circuit illustrated in FIG. 21.

FIG. 22 is a circuit diagram, according to an embodiment, of the write latch signal generation circuit 331 of FIG. 21. As illustrated in FIG. 22, the write latch signal generation circuit 331 may include an inverter 311 and NAND gates 3313, 3315, and 3317. The inverter 3311 may inversely buffer the write enable signal WEN to output an inversely buffered signal of the write enable signal WEN. The NAND gate 3313 may receive an output signal of the inverter 3311 and the detection signal CS_DET to perform a logical NAND operation. The NAND gate 3315 may receive an output signal of the NAND gate 3313 and an output signal of the NAND gate 3317 to perform a logical NAND operation, thereby generating the write latch signal WLAT. The NAND gate 3317 may receive an output signal of the NAND gate 3315 and the detection signal CS_DET to perform a logical NAND operation. The write latch signal generation circuit 331 may generate the write latch signal WLAT that is activated to a logic "high" level when the detection signal CS_DET is activated to a logic "high" level while the write enable signal WEN is inactivated to a logic "low" level to perform a write operation. The write latch signal generation circuit 331 may generate the write latch signal WLAT that is inactivated to a logic "low" level when the detection signal CS_DET is inactivated to a logic "low" level while the write operation is performed and the write enable signal WEN is activated to a logic "high" level.

Figure 23:
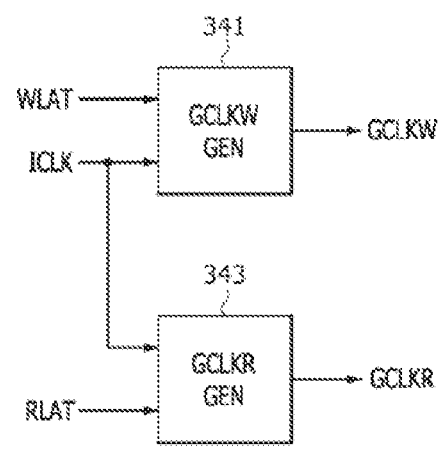
FIG. 23 is a block diagram illustrating a configuration of a gating clock generation circuit included in the electronic device illustrated in FIG. 18.

FIG. 23 is a block diagram illustrating a configuration, according to an embodiment, of the gating clock generation circuit 313 of FIG. 18. As illustrated in FIG. 23, the gating clock generation circuit 313 may include a write gating clock generation circuit 341 and a read gating clock generation circuit 343.

The write gating clock generation circuit 341 may generate a write gating clock GCLKW based on the write latch signal WLAT and the internal clock ICLK. The write gating clock generation circuit 341 may buffer the internal clock ICLK to output a buffered signal of the internal dock ICLK as the write gating clock GCLKW when the write latch signal WLAT is activated.

The read gating dock generation circuit 343 may generate a read gating clock GCLKR based on the read latch signal RLAT and the internal clock ICLK. The read gating dock generation circuit 343 may buffer the internal clock ICLK to output a buffered signal of the internal clock ICLK as the read gating clock GCLKR when the read latch signal RLAT is activated.

Figure 24:
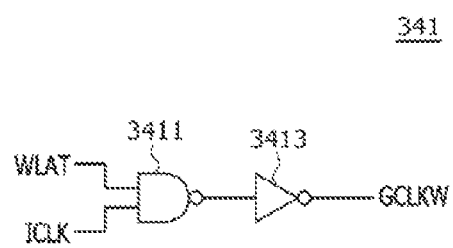
FIG. 24 is a circuit diagram illustrating a write gating clock generation circuit included in the gating clock generation circuit illustrated in FIG. 23.

FIG. 24 is a circuit diagram, according to an embodiment, of the write gating clock generation circuit 341 of FIG. 23. As illustrated in FIG. 24, the write gating clock generation circuit 341 may include a NAND gate 3411 and an inverter 3413. The NAND gate 3411 may receive the write latch signal WLAT and the internal clock ICLK to perform a logical NAND operation. The inverter 3413 may inversely buffer an output signal of the NAND gate 3411 to generate the write gating clock GCLKW. The write gating clock generation circuit 341 may buffer the internal clock ICLK to output a buffered signal of the internal clock ICLK as the write gating clock GCLKW when the write latch signal WLAT is activated to a logic "high" level.

Figure 25:
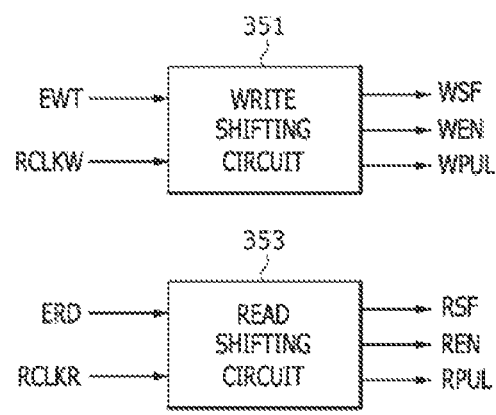
FIG. 25 is a block diagram illustrating a configuration of a shifting circuit included in the electronic device illustrated in FIG. 18.

FIG. 25 is a block diagram illustrating a configuration, according to an embodiment, of the shifting circuit 317 of FIG. 18. As illustrating in FIG. 25, the shifting circuit 317 may include a write shifting circuit 351 and a read shifting circuit 353.

The write shifting circuit 351 may generate the write shifting flag WSF, the write enable signal WEN, and the write pulse WPUL based on the write signal EWT and the write repeating dock RCLKW. The write shifting circuit 351 may inactivate the write shifting flag WSF and may activate the write enable signal WEN when the write signal EWT is activated. The write shifting circuit 351 may generate the write shifting flag WSF that maintains an inactivated state for as long as a write flag period set by the write repeating clock RCLKW when the write signal EWT is activated. The write shifting circuit 351 may activate the write enable signal WEN that maintains an activated state for as long as a write enable period set by the write repeating clock RCLKW when the write signal EWT is activated. The write shifting circuit 351 may generate the write pulse WPUL that is activated at a time point when the write signal EWT is activated and a write shifting period has elapsed in synchronization with the write repeating clock RCLKW.

The read shifting circuit 353 may generate the read shifting flag RSF, the read enable signal REN, and the read pulse RPUL based on the read signal ERD and the read repeating clock RCLKR. The read shifting circuit 353 may generate the read shifting flag RSF that maintains an inactivated state for as long as a read flag period set by the read repeating clock RCLKR when the read signal ERD is activated. The read shifting circuit 353 may activate the read enable signal REN that maintains an activated state for as long as a read enable period set by the read repeating clock RCLKR when the read signal ERD is activated. The read shifting circuit 353 may generate the read pulse RPUL that is activated at a time point when the read signal ERD is activated and the read shifting period has elapsed in synchronization with the read repeating clock RCLKR.

Figure 26:
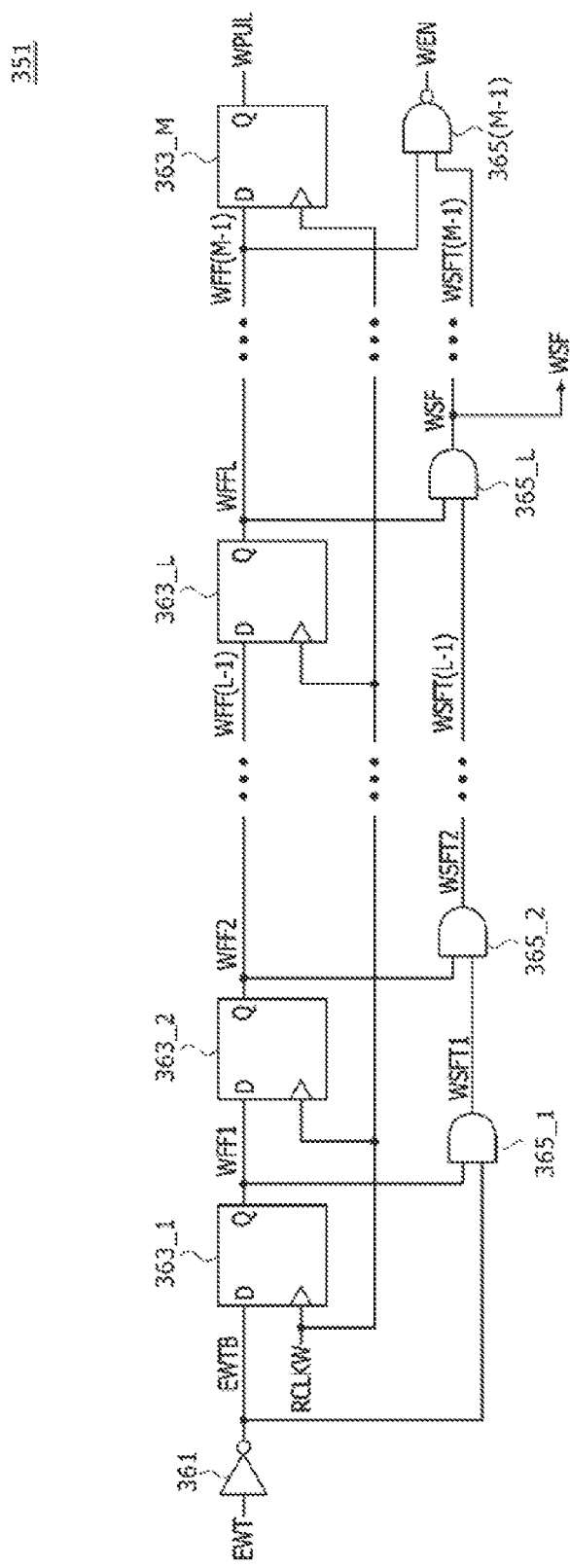
FIG. 26 is a circuit diagram illustrating a write shifting circuit included in the shifting circuit illustrated in FIG. 25.

FIG. 26 is a circuit diagram, according to an embodiment, of the write shifting circuit 351 of FIG. 25. As illustrated in FIG. 26, the write shifting circuit 351 may include an inverter 361, first to $M^{th}$ write shifting latches 361_1~363_M, first to $L^{th}$ AND gates 365_1~365_L, and a NAND gate 365_(M-1). The inverter 361 may inversely buffer the write signal EWT to generate an inverted write signal EWTB. The first write shifting latch 363_1 may latch the inverted write signal EWTB in synchronization with the write repeating clock RCLKW and may output a latched signal of the inverted write signal EWTB as a first latch pulse WFF1. The second write shifting latch 363_2 may latch the first latch pulse WFF1 in synchronization with the write repeating clock RCLKW and may output a latched signal of the first latch pulse WFF1 as a second latch pulse WFF2. The $L^{th}$ write shifting latch 363_L may latch the L-1$^{th}$ latch pulse WFF(L-1) in synchronization with the write repeating clock RCLKW, and may output a latched signal of the L-1$^{th}$ latch pulse WFF(L-1) as a $L^{th}$ latch pulse WFFL. The $M^{th}$ write shifting latch 363_M may latch an M-1$^{th}$ latch pulse WFF(M-1) in synchronization with the write repeating dock RCLKW, and may output a latched signal of the M-1$^{th}$ latch pulse WFF(M-1) as the write pulse WPUL, The first AND gate 365_1 may receive the inverted write signal EWTB and the first latch pulse WFF1 and may perform a logical AND operation to generate a first shifting pulse WSFT1. The second AND gate 365_2 may receive the first shifting pulse WSFT1 and the second latch pulse WFF2 and may perform a logical AND operation to generate a second shifting pulse WSFT2. The $L^{th}$ AND gate 365_L may receive an L-1$^{th}$ shifting pulse WSFT(L-1) and the $L^{th}$ latch pulse WFFL and may perform a logical AND operation to generate the write shifting flag WSF. The NAND gate 365_(M-1) may receive the M-1$^{th}$ shifting pulse WSFT(M-1) and the M-1$^{th}$ latch pulse WFF(M-1) and may perform a logical NAND operation to generate the write enable signal WEN. The write shifting circuit 351 may inactivate the write shifting flag WSF to a logic "low" level and may activate the write enable signal WEN to a logic "high" level when the write signal EWT is activated to a logic "high" level. The write shifting circuit 351 may generate the write shifting flag WSF that maintains an inactivated state in a logic "low" level for as long as a write flag period set by the write repeating clock RCLKW when the write signal EWT is activated to a logic "high" level. The write shifting circuit 351 may activate the write enable signal WEN that maintains an inactivated state in a logic "high" level for as long as a write enable period set by the write repeating clock RCLKW when the write signal EWT is activated to a logic "high" level. The write shifting circuit 351 may generate the write pulse WPUL that is activated to a logic "high" level at a time point when the write signal EWT is activated to a logic "high" level and a write shifting period has elapsed in synchronization with the write repeating clock RCLKW. The write flag period, the write enable period, and the write shifting period may be variously set according to embodiments by adjusting the numbers of the write shifting latches and the AND gates included in the write shifting circuit 351.

Figure 27:
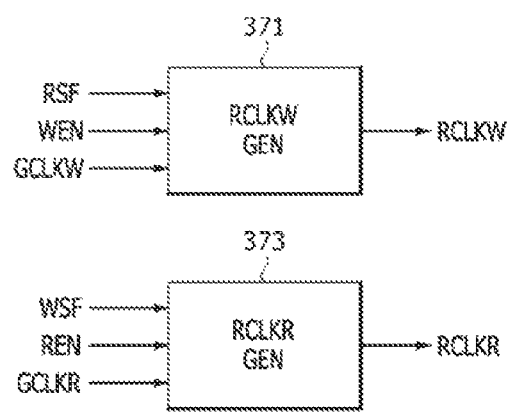
FIG. 27 is a block diagram illustrating a configuration of a clock repeater included in the electronic device illustrated in FIG. 18.

FIG. 27 is a block diagram illustrating a configuration, according to an embodiment, of the clock repeater 319 of FIG. 18. As illustrated in FIG. 27, the clock repeater 319 may include a write repeating clock generation circuit 371 and a read repeating clock generation circuit 373.

The write repeating clock generation circuit 371 may generate the write repeating clock RCLKW from the write gating clock GCLKW, based on the read shifting flag RSF and the write enable signal WEN. The write repeating clock generation circuit 371 may buffer the write gating clock GCLKW to generate the write repeating clock RCLKW when the read shift flag RSF initialized to an activated state and the write enable signal WEN initialized to an inactivated state are input before the write signal EWT or the read signal ERD is activated. The write repeating clock generation circuit 371 may buffer the write gating clock GCLKW by the write enable signal WEN that is activated when a write operation is performed and the write signal EWT is activated to generate the write repeating clock RCLKW. The write repeating clock generation circuit 371 may block an operation of generating the write repeating clock RCLKW from the write gating clock GCLKW when a read operation is performed and the read shifting flag RSF whose logic level is changed into an inactivated state by the activated read signal ERD is received, thereby preventing unnecessary power consumption.

The read repeating clock generation circuit 373 may generate the read repeating clock RCLKR from the read gating clock GCLKR, based on the write shifting flag WSF and the read enable signal REN. The read repeating clock generation circuit 373 may buffer the read gating clock GCLKR to generate the read repeating clock RCLKR when the write shifting flag WSF initialized to have an activated state and the read enable signal REN initialized to have an inactivated state are input before the write signal EWT or the read signal ERD is activated. The read repeating clock generation circuit 373 may buffer the read gating clock GCLKR by the read enable signal REN that is activated when a write operation is performed and the read signal ERD is activated to generate the read repeating clock RCLKR. The read repeating clock generation circuit 373 may block an operation of generating the read repeating clock RCLKR from the read gating clock GCLKR when a write operation is performed and the write shifting flag WSF that has changed into an inactivated state by the activated write signal EWT is received, thereby preventing unnecessary power consumption.

Figure 28:
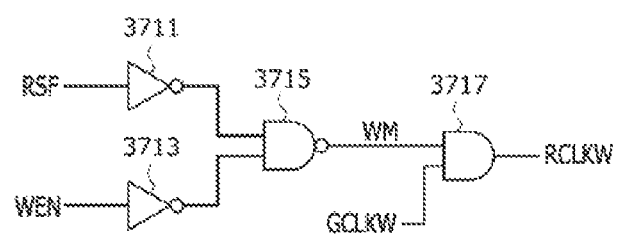
FIG. 28 is a circuit diagram illustrating a write repeating clock generation circuit included in the clock repeater illustrated in FIG. 27.

FIG. 28 is a circuit diagram, according to an embodiment, of the write repeating dock generation circuit 371 of FIG. 27. As illustrated in FIG. 28, the write repeating dock generation circuit 371 may include inverters 3711 and 3713, a NAND gate 3715, and an AND gate 3717. The inverter 3711 may inversely buffer the read shifting flag RSF. The inverter 3713 may inversely buffer the write enable signal WEN. The NAND gate 3715 may receive an output signal of the inverter 3711 and an output signal of the inverter 3713 and may perform a logical NAND operation to generate a write clock masking signal WM. The AND gate 3717 may receive the write clock masking signal WM and the write gating clock GCLKW and may perform a logical AND operation to generate the write repeating clock RCLKW. The write repeating clock generation circuit 371 may generate the write clock masking signal WM in a logic "high" level when the read shifting flag RSF initialized to an activated state of a logic "high" level and the write enable signal WEN initialized to an inactivated state of a logic "low" level are input before a write operation or a read operation is performed. In addition, the write repeating clock generation circuit 371 may generate a write clock masking signal WM of a logic "high" level by the write enable signal WEN that is activated to a logic "high" level when a write operation is performed so that the write signal EWT is activated to a logic "high" level. The write repeating clock generation circuit 371 may buffer the write gating dock GCLKW to generate the write repeating dock RCLKW when the write dock masking signal WM of a logic "high" level is generated. The write repeating dock generation circuit 371 may generate a write dock masking signal WM of a logic "low" level when a read operation is performed so that the read shifting flag RSF whose logic level is changed into an inactivated state by the activated read signal ERD is received. The write repeating dock generation circuit 371 may block an operation of generating the write repeating dock RCLKW from the write gating clock GCLKW when the write clock masking signal WM of a logic "low" level is generated, thereby preventing unnecessary power consumption.

Figure 29:
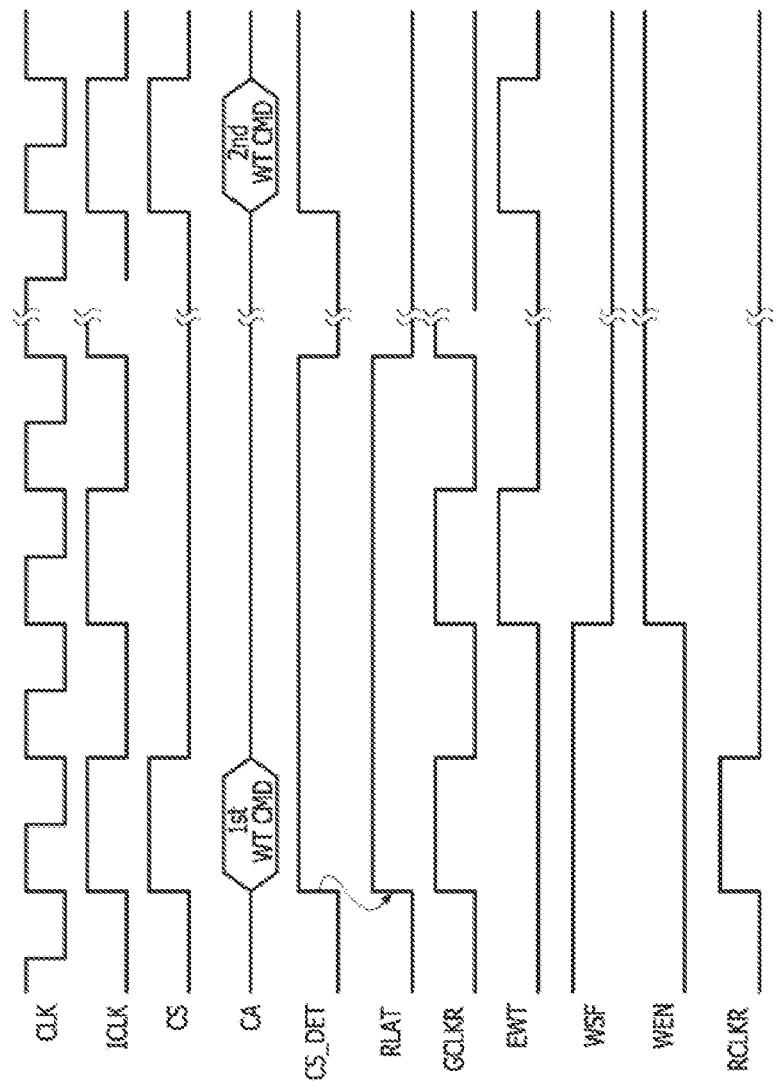
FIGS. 29 and 30 are timing diagrams illustrating an operation of the electronic device illustrated in FIG. 18.
Figure 30:
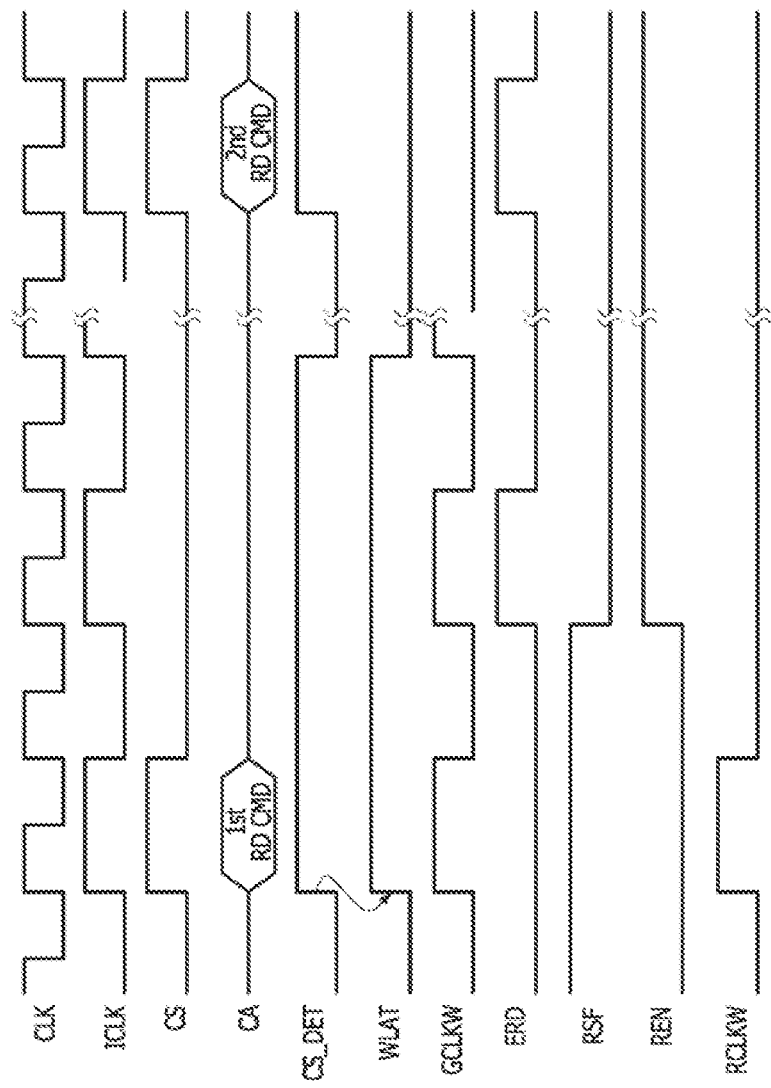

FIGS. 29 and 30 are timing diagrams illustrating operations of the electronic device 120b illustrated in FIG. 18.

Referring to FIG. 29, write operations successively performed in the electronic device 120b will be described as follows.

First, a first write operation is performed when the chip select signal CS activated to a logic "high" level in synchronization with the internal clock ICLK generated by dividing the clock CLK and a first write command 1st WT CMD are input. The detection signal CS_DET is activated to a logic "high" level in synchronization with the chip selection signal CS activated to a logic "high" level, and a read latch signal RLAT is activated to a logic "high" level in synchronization with the detection signal CS_DET activated to a logic "high" level. The read gating clock GCLKR is generated from the internal clock ICLK during a period in which the read latch signal RLAT is activated to a logic "high" level. Because the write shifting flag WSF remains initialized to a logic "high" level during a period from the input of the first write command 1st WT CMD to the activation of the write signal EWT to a logic "high" level, the read repeating clock RCLKR is generated from the read gating clock GCLKR.

Next, a logic level of the write shifting flag WSF changes from a logic "high" level into a logic "low" level when the write signal EWT is activated to a logic "high" level. The operation of generating the read repeating clock RCLKR from the read gating clock GCLKR is blocked by the write shifting flag WSF inactivated to a logic "low" level during the write flag period. The write shifting flag WSF remains inactivated when a write command 2nd WT CMD for a second write operation is input during the write flag period, so that the operation of generating the read repeating clock RCLKR from the read gating clock GCLKR is continuously blocked.

As described above, in the electronic device 120b according to the present embodiment, the read repeating clock RCLKR for the read operation is generated during the period from when the first write command 1st WT CMD is input until the write signal EWT is activated to a logic "high" level, but the read repeating clock RCLKR is prevented from being generated during the write flag period from the time point when the write signal EWT is activated to a logic "high" level, thereby reducing power consumption. In addition, the electronic device 120b according to the present embodiment may reduce power consumption by continuously blocking the generation of the read repeating clock RCLKR when write operations are continuously performed.

Referring to FIG. 30, a read operation continuously performed in the electronic device 120b will be described as follows.

First, a first read operation is performed when a chip selection signal CS activated to a logic "high" level and a first read command 1st RD CMD are input in synchronization with the internal clock ICLK generated by dividing the clock CLK. The detection signal CS_DET is activated to a logic "high" level in synchronization with the chip selection signal CS activated to a logic "high" level, and the write latch signal WLAT is activated to a logic "high" level in synchronization with the detection signal CS_DET activated to a logic "high" level. The write gating clock GCLKW is generated from the internal clock ICLK during a period in which the write latch signal WLAT is activated to a logic "high" level. The read shifting flag RSF remains initialized to a logic "high" level during a period from the first read command 1st RD CMD is input until the read signal ERD is activated to a logic "high" level, so that the write repeating clock RCLKW is generated from the write gating clock GCLKW.

Next, a logic level of the read shifting flag RSF changes from a logic "high" level into a logic "low" level when the read signal ERD is activated to a logic "high" level. The operation of generating the write repeating dock RCLKW from the write gating dock GCLKW is blocked by the read shifting flag RSF inactivated to a logic "low" level during the read flag period. The read shifting flag RSF remains inactivated when a read command 2nd RD CMD for a second read operation is input during the read flag period, so that the operation of generating the write repeating clock RCLKW from the write gating clock GCLKW is continuously blocked.

As described above, in the electronic device 120b according to the present embodiment, the write repeating clock RCLKW for the write operation is generated during the period from the first read command 1st RD CMD is input until the read signal ERD is activated to a logic "high" level, but the write repeating clock RCLKW is prevented from being generated during the read flag period from the time point when the read signal ERD is activated to a logic "high" level, thereby reducing power consumption. In addition, the electronic device 120b according to the present embodiment may reduce power consumption by continuously blocking the generation of the write repeating clock RCLKW when read operations are continuously performed.

Figure 31:
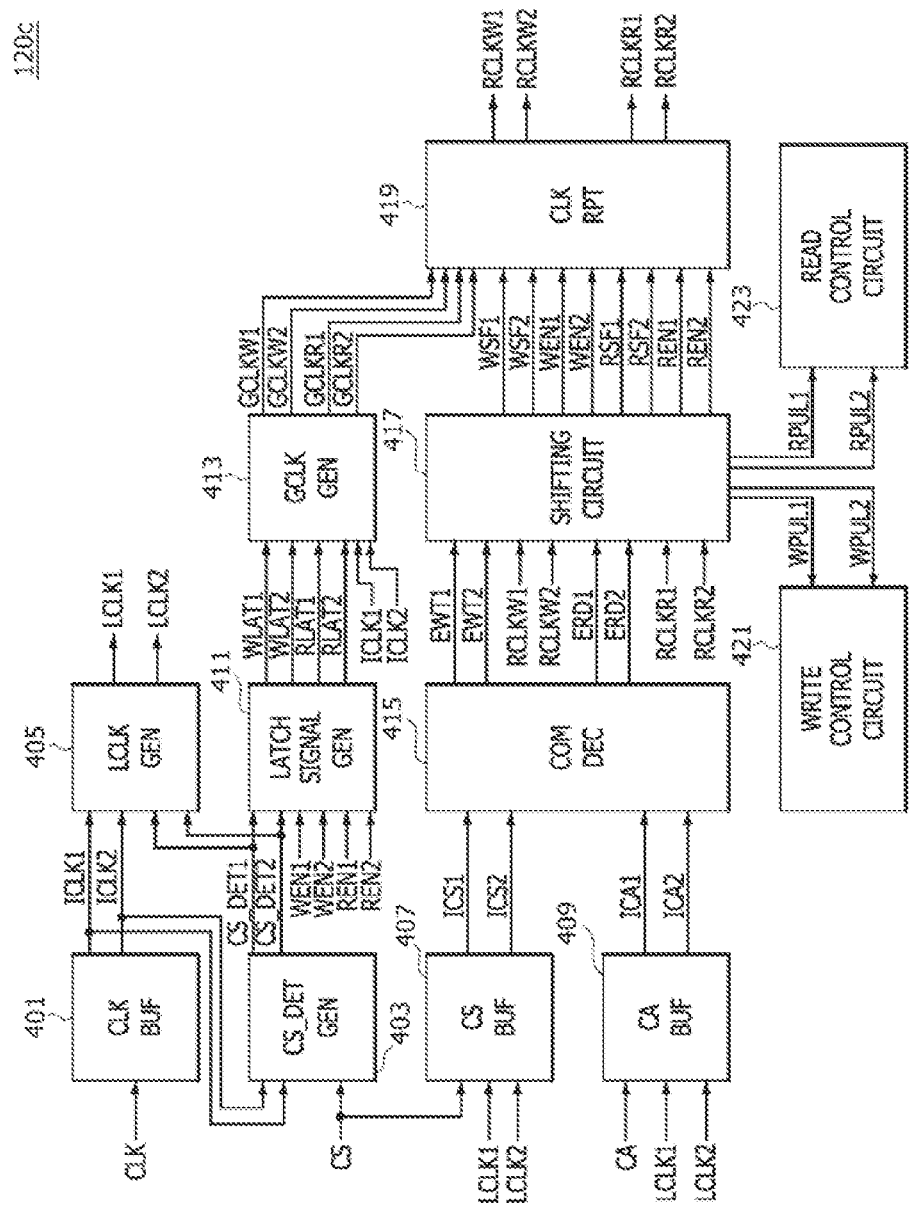
FIG. 31 is a block diagram illustrating a configuration of the electronic device included in the electronic system illustrated in FIG. 1.

FIG. 31 is a block diagram illustrating a configuration of an electronic device 120c according to still another embodiment of the electronic device 120 illustrated in FIG. 1. As illustrated in FIG. 31, the electronic device 120c may include a clock buffer circuit 401, a detection signal generation circuit 403, a latch dock generation circuit 405, a chip selection signal buffer circuit 407, a command buffer circuit 409, a latch signal generation circuit 411, a gating dock generation circuit 413, a command decoder 415, a shifting circuit 417, a clock repeater 419, a write control circuit 421, and a read control circuit 423.

The dock buffer circuit 401 may generate a first internal clock ICLK1 and a second internal clock ICLK2 based on a dock CLK. The dock buffer circuit 401 may divide the dock CLK to generate the first internal dock ICLK1 and the second internal dock ICLK2. In the present embodiment, the first internal clock ICLK1 and the second internal clock ICLK2 may be set to have opposite phases, but this is only an embodiment and the present disclosure is not limited thereto.

The detection signal generation circuit 403 may generate a first detection signal CS_DET1 and a second detection signal CS_DET2 based on the first internal dock ICLK1, the second internal clock ICLK2, and a chip selection signal CS. The detection signal generation circuit 403 may activate the first detection signal CS_DET1 and the second detection signal CS_DET2 when the chip selection signal CS is activated. The detection signal generation circuit 403 may generate the first detection signal CS_DET1 that maintains an activated state for a first period set in the first internal clock ICLK1 from a time point when the chip selection signal CS is activated. The logic level and the first period at which the first detection signal CS_DET1 is activated may be variously set according to embodiments. The detection signal generation circuit 403 may generate the second detection signal CS_DET2 that maintains an activated state for a second period set in the second internal dock ICLK2 from a time point when the chip selection signal CS is activated. The logic level and the second period at which the second detection signal CS_DET2 is activated may be variously set according to embodiments.

The latch clock generation circuit 405 may generate a first latch clock LCLK1 and a second latch clock LCLK2 based on the first detection signal CS_DET1, the second detection signal CS_DET2, the first internal clock ICLK1, and the second internal clock ICLK2. The latch clock generation circuit 405 may buffer the first internal clock ICLK1 to output a buffered signal of the first internal clock ICLK1 as the first latch clock LCLK1 when the first detection signal CS_DET1 is activated. The latch clock generation circuit 405 may activate the first latch clock LCLK1 during a period in which the first detection signal CS_DET1 is activated. The latch clock generation circuit 405 may buffer the second internal clock ICLK2 to output a buffered signal of the second internal clock ICLK2 as the second latch clock LCLK2. The latch clock generation circuit 405 may activate the second latch clock LCLK2 during a period in which the second detection signal CS_DET2 is activated.

The chip selection signal buffer circuit 407 may generate a first internal chip selection signal ICS1 and a second internal chip selection signal ICS2 based on the first latch clock LCLK1, the second latch dock ICLK2, and the chip selection signal CS. The chip selection signal buffer circuit 407 may latch the chip selection signal CS to output a latched signal of the chip selection signal CS as the first internal chip selection signal ICS1 when the first latch dock LCLK1 is activated. The chip selection signal buffer circuit 407 might latch the chip selection signal CS only when the first latch clock LCLK1 is activated to reduce power consumption. The chip selection signal buffer circuit 407 may latch the chip selection signal CS to output a latched signal of the chip selection signal CS as the second internal chip selection signal ICS2 when the second latch clock LCLK2 is activated. The chip selection signal buffer circuit 407 might latch the chip selection signal CS only when the second latch clock LCLK2 is activated to reduce power consumption.

The command buffer circuit 409 may generate a first internal command ICA1 and a second internal command ICA2 based on the first latch clock LCLK1, a second latch clock ICLK2, and a command CA. The command buffer circuit 409 may latch the command CA to output a latched signal of the command CA as the first internal command ICA1 when the first latch clock LCLK1 is activated. The command buffer circuit 409 might latch the command CA only when the first latch clock LCLK1 is activated to reduce power consumption, The command buffer circuit 409 may latch the command CA to output a latched signal of the command CA as the second internal command ICA2 when the second latch dock LCLK2 is activated. The command buffer circuit 409 might latch the command CA only when the second latch clock LCLK2 is activated to reduce power consumption.

The latch signal generation circuit 411 may receive the first detection signal CS_DET1 and the second detection signal CS_DET2 from the detection signal generation circuit 403. The latch signal generation circuit 411 may receive a first write enable signal WEN1, a second write enable signal WEN2, a first read enable signal REN1, and a second read enable signal REN2 from the shifting circuit 417. The latch signal generation circuit 411 may generate a first write latch signal WLAT1 and a first read latch signal RLAT1 based on the first detection signal CS_DET1, the first write enable signal WEN1, and the first read enable signal REN1. The latch signal generation circuit 411 may generate the first write latch signal WLAT1 and the first read latch signal RLAT1 that are both activated when the first detection signal CS_DET1 is activated to perform a write operation or a read operation. The latch signal generation circuit 411 may generate the first write latch signal WLAT1 that is inactivated when the first detection signal CS_DET1 is inactivated while a write operation is performed so that the first write enable signal WEN1 is activated. The latch signal generation circuit 411 may generate the first read latch signal RLAT1 that is inactivated when the first detection signal CS_DET1 is inactivated while a read operation is performed so that the first read enable signal REN1 is activated. The latch signal generation circuit 411 may generate a second write latch signal WLAT2 and a second read latch signal RLAT2 based on the second detection signal CS_DET2, the second write enable signal WEN2, and the second read enable signal REN2. The latch signal generation circuit 411 may generate the second write latch signal WLAT2 and the second read latch signal RLAT2 that are both activated when the second detection signal CS_DET2 is activated to perform a write operation or a read operation. The latch signal generation circuit 411 may generate the second write latch signal WLAT2 that is inactivated when the second detection signal CS_DET2 is inactivated while a write operation is performed so that the second write enable signal WEN2 is activated. The latch signal generation circuit 411 may generate the second read latch signal RLAT2 that is inactivated when the second detection signal CS_DET2 is inactivated while a read operation is performed so that the second read enable signal REN2 is activated.

The gating clock generation circuit 413 may receive the first internal clock ICLK1 and the second internal clock ICLK2 from the clock buffer circuit 401. The gating clock generation circuit 413 may receive the first write latch signal WLAT1, the second write latch signal WLAT2, the first read latch signal RLAT1, and the second read latch signal RLAT2 from the latch signal generation circuit 411. The gating clock generation circuit 413 may generate a first write gating clock GCLKW1 and a first read gating clock GCLKR1 from the first write latch signal WLAT1, the first read latch signal RLAT1, and the first internal clock ICLK1. The gating clock generation circuit 413 may generate the first write gating clock GCLKW1 from the first internal clock ICLK1 based on the first write latch signal WLAT1. The gating clock generation circuit 413 may buffer the first internal clock ICLK1 to output a latched signal of the first internal clock ICLK1 as the first write gating clock GCLKW1 when the first write latch signal WLAT1 is activated. The gating clock generation circuit 413 may generate the first read gating clock GCLKRI from the first internal clock ICLK1 based on the first read latch signal RLAT1. The gating clock generation circuit 413 may buffer the first internal clock ICLK1 to output a latched signal of the first internal clock ICLK1 as the first read gating clock GCLKR1 when the first read latch signal RLAT1 is activated. The gating clock generation circuit 413 may generate a second write gating clock GCLKW2 and a second read gating clock GCLKR2 from the second write latch signal WLAT2, the second read latch signal RLAT2, and the second internal clock ICLK2. The gating clock generation circuit 413 may generate the second write gating clock GCLKW2 from the second internal clock ICLK2 based on the second write latch signal WLAT2. The gating clock generation circuit 413 may buffer the second internal clock ICLK2 to output a latched signal of the second internal dock ICLK2 as the second write gating clock GCLKW2 when the second write latch signal WLAT2 is activated. The gating clock generation circuit 413 may generate the second read gating clock GCLKR2 from the second internal clock ICLK2 based on the second read latch signal RLAT2. The gating clock generation circuit 413 may buffer the second internal clock ICLK2 to output a latched signal of the second internal clock ICLK2 as the second read gating clock GCLKR2 when the second read latch signal RLAT2 is activated.

The command decoder 415 may generate a first internal operation signal and a second internal operation signal based on the first internal chip selection signal ICS1, the second internal chip selection signal ICS2, the first internal command ICA1, and the second internal command ICA2. The first internal operation signal may include a first write signal EWT1 and a first read signal ERD1, and the second internal operation signal may include a second write signal EWT2 and a second read signal ERD2. The command decoder 415 may decode the first internal command ICA1 according to the first internal chip selection signal ICS1 to generate the first write signal EWT1 and the first read signal ERD1. The command decoder 415 may decode the sequentially input first command ICA1 based on the first internal chip selection signal ICS1 to activate the first write signal EWT1 and the first read signal ERD1. The first write signal EWT1 may be activated for a write operation. The first read signal ERD1 may be activated for a read operation. The command decoder 415 may decode the second internal command ICA2 according to the second internal chip selection signal ICS2 to generate the second write signal EWT2 and the second read signal ERD2. The command decoder 415 may decode the sequentially input second command ICA2 based on the second internal chip selection signal ICS1 to activate the second write signal EWT2 and the second read signal ERD1.

The shifting circuit 417 may receive the first write signal EWT1, the second write signal EWT2, the first read signal ERD1, and the second read signal ERD2 from the command decoder 415. The shifting circuit 417 may receive the first write repeating clock RCLKW1, the second write repeating clock RCLKW2, the first read repeating clock RCLKR1, and the second read repeating clock RCLKR2 from the clock repeater 419. The shifting circuit 417 may generate a first write shifting flag WSF1, a first write enable signal WEN1, a first write pulse WPUL1, a first read shifting flag RSF1, a first read enable signal REN1, and a first read pulse RPUL1 based on the first write signal EWT1, the first read signal ERDI, the first write repeating clock RCLKW1, and the first read repeating clock RCLKR1. The shifting circuit 417 may generate a second write shifting flag WSF2, a second write enable signal WEN2, a second write pulse WPUL2, a second read shifting flag RSF2, a second read enable signal REN2, and a second read pulse RPUL2 based on the second write signal EWT2, the second read signal ERD2, the second write repeating clock RCLKW2, and the second read repeating clock RCLKR2.

The shifting circuit 417 may inactivate the first write shifting flag WSF1 and may activate the first write enable signal WEN1 when the first write signal EWT1 is activated. The first write shifting flag WSF1 may be initialized to have an activated state and the first write activation signal WEN1 may be initialized to have an inactivated state before the first write signal EWT1 is activated. A logic level at which each of the first write shifting flag WSF1 and the first write enable signal WEN1 is initialized and a logic level at which each of the first write shifting flag WSF1 and the first write enable signal WEN1 is activated may be set in various ways according to embodiments. The shifting circuit 417 may generate the first write shifting flag WSF1 that maintains an inactivated state for as long as a write flag period set by the first write repeating clock RCLKW1 when the first write signal EWT1 is activated. The shifting circuit 417 may activate the first write enable signal WEN1 that maintains an activated state for as long as a write enable period set by the first write repeating clock RCLKW1 when the first write signal EWT1 is activated. The shifting circuit 417 may generate the first write pulse WPUL1 that is activated at a time point when the first write signal EWT1 is activated and the write shifting period elapses in synchronization with the first write repeating clock RCLKW1. The logic level at which the first write pulse WPUL1 is activated may be variously set according to embodiments. In the present embodiment, the write shifting period may be set larger than the write enable period, and the write enable period may be set larger than the write flag period.

The shifting circuit 417 may inactivate the second write shifting flag WSF2 and may activate the second write enable signal WEN2 when the second write signal EWT2 is activated. The second write shifting flag WSF2 may be initialized to have an activated state and the second write enable signal WEN2 may be initialized to have an inactivated state before the second write signal EWT2 is activated. The logic level at which each of the second write shifting flag WSF2 and the second write enable signal WEN2 is initialized and the logic level at which each of the second write shifting flag WSF2 and the second write enable signal WEN2 is activated may be set in various ways according to embodiments. The shifting circuit 417 may generate the second write shifting flag WSF2 that maintains an inactivated state for as long as the write flag period set by the second write repeating clock RCLKW2 when the second write signal EWT2 is activated. The shifting circuit 417 may activate the second write enable signal WEN2 that maintains an activated state for as long as the write enable period set by the second write repeating clock RCLKW2 when the second write signal EWT2 is activated. The shifting circuit 417 may generate the second write pulse WPUL2 that is activated at a time point when the second write signal EWT2 is activated and the write shifting period has elapsed in synchronization with the second write repeating clock RCLKW2. The logic level at which the second write pulse WPUL2 is activated may be variously set according to embodiments.

The shifting circuit 417 may inactivate the first read shifting flag RSF1 and may activate the first read enable signal REN1 when the first read signal ERD1 is activated. The first read shifting flag RSF1 may be initialized to have an activated state and the first read enable signal REN1 may be initialized to have an inactivated state before the first read signal ERD1 is activated. The logic level at which each of the first read shifting flag RSF1 and the first read enable signal REN1 is initialized and the logic level at which each of the first read shifting flag RSF1 and the first read enable signal REN1 is activated may be set in various ways according to embodiments. The shifting circuit 417 may generate the first read shifting flag RSF1 that maintains an inactivated state for as long as a read flag period set by the first read repeating clock RCLKR1 when the first read signal ERD1 is activated. The shifting circuit 417 may activate the first read enable signal REN1 that maintains an activated state for as long as a read enable period set by the first read repeating dock RCLKR1 when the first read signal ERD1 is activated. The shifting circuit 417 may generate the first read pulse RPUL1 that is activated at a time point when the first read signal ERD1 is activated and the read shifting period has elapsed in synchronization with the first read repeating dock RCLKR1. The logic level at which the first read pulse RPUL1 is activated may be variously set according to embodiments. In the present embodiment, the read shifting period may be set larger than the read enable period, and the read enable period may be set larger than the read flag period.

The shifting circuit 417 may inactivate the second read shifting flag RSF2 and may activate the second read enable signal REN2 when the second read signal ERD2 is activated. The second read shifting flag RSF2 may be initialized to have an activated state and the second read enable signal REN2 may be initialized to have an inactivated state before the second read signal ERD2 is activated. The logic level at which each of the second read shifting flag RSF2 and the second read enable signal REN2 is initialized and the logic level at which each of the second read shifting flag RSF2 and the second read enable signal REN2 is activated may be set in various ways according to embodiments. The shifting circuit 417 may generate the second read shifting flag RSF2 that maintains an inactivated state for as long as the read flag period set by the second read repeating clock RCLKR2 when the second read signal ERD2 is activated. The shifting circuit 417 may activate the second read enable signal REN2 that maintains an activated state for as long as the read enable period set by the second read repeating clock RCLKR2 when the second read signal ERD2 is activated. The shifting circuit 417 may generate the second read pulse RPUL2 that is activated at a time point when the second read signal ERD2 is activated and the read shifting period has elapsed in synchronization with the second read repeating clock RCLKR2. The logic level at which the second read pulse RPUL2 is activated may be variously set according to embodiments.

The clock repeater 419 may receive the first write gating clock GCLKW1, the second write gating clock GCLKW2, the first read gating clock GCLKRI, and the second read gating clock GCLKR2 from the gating clock generation circuit 413. The clock repeater 419 may receive the first write shifting flag WSF1, the second write shifting flag WSF2, the first write enable signal WEN1, the second write enable signal WEN2, the first read shifting flag RSF1, the second read shifting flag RSF2, the first read enable signal REN1, and the second read enable signal REN2 from the shifting circuit 417. The clock repeater 419 may generate a first write repeating clock RCLKWI and a first read repeating clock RCLKRI from the first write gating clock GCLKW1 and the first read gating clock GCLKRI based on the first write shifting flag WSF1, the first write enable signal WEN1, the first read shifting flag RSFI, and the first read enable signal REN1. The clock repeater 419 may generate a second write repeating clock RCLKW2 and a second read repeating clock RCLKR2 from the second write gating clock GCLKW2 and the second read gating clock GCLKR2 based on the second write shifting flag WSF2, the second write enable signal WEN2, the second read shifting flag RSF2, and the second read enable signal REN2.

The dock repeater 419 may generate the first write repeating dock RCLKW1 from the first write gating dock GCLKW1 based on the first read shifting flag RSF1 and the first write enable signal WEN1. The dock repeater 419 may buffer the first write gating dock GCLKWI to generate the first write repeating dock RCLKW1 when the first read shifting flag RSF1 initialized to have an activated state and the first write enable signal WEN1 initialized to have an inactivated state are input before the first write signal EWT1 or the first read signal ERD1 is activated. The clock repeater 419 may buffer the first write gating clock GCLKWI to generate the first write repeating clock RCLKW1 by the first write enable signal WEN1 that is activated when a write operation is performed so that the first write signal EWT1 is activated. The clock repeater 419 may block an operation of generating the first write repeating clock RCLKW1 from the first write gating clock GCLKW1 when a read operation is performed so that the first read shifting flag RSF1 whose logic level is changed into an inactivated state by the activated first read signal ERD1 is received. In the electronic device 120b according to the present embodiment, the operation of generating the first write repeating clock RCLKW1 is blocked during the read flag period in which the read operation is performed and the first read shifting flag RSF1 is maintained in an inactivated state, thereby preventing power consumption for generating unnecessary clocks in the read operation.

The dock repeater 419 may generate the second write repeating dock RCLKW2 from the second write gating dock GCLKW2 based on the second read shifting flag RSF2 and the second write enable signal WEN2. The dock repeater 419 may buffer the second write gating dock GCLKW2 to generate the second write repeating clock RCLKW2 when the second read shifting flag RSF2 initialized to an activated state and the second write enable signal WEN2 initialized to an inactivated state are input before the second write signal EWT2 or the second read signal ERD2 is activated. The dock repeater 419 may buffer the second write gating dock GCLKW2 by the second write enable signal WEN1 that is activated when a write operation is performed so that the second write signal EWT2 is activated to generate the second write repeating dock RCLKW2. The clock repeater 419 may block an operation of generating the second write repeating clock RCLKW2 from the second write gating clock GCLKW2 when a read operation is performed and the second read shifting flag RSF2 changed into an inactivated state by the activated second read signal ERD2 is received. In the electronic device 120b according to the present embodiment, the operation of generating the second write repeating clock RCLKW2 is blocked during the read flag period in which the read operation is performed and the second read shifting flag RSF2 is maintained in an inactivated state, thereby preventing power consumption for generating unnecessary docks in the read operation.

The dock repeater 419 may generate the first read repeating clock RCLKR1 from the first read gating clock GCLKR1 based on the first write shifting flag WSF1 and the first read enable signal REN1. The clock repeater 419 may buffer the first read gating clock GCLKR1 to generate the first read repeating clock RCLKRI when the first write shifting flag WSF1 initialized to an activated state and the first read enable signal REN1 initialized to an inactivated state are input before the first write signal EWT1 or the first read signal ERD1 is activated. The clock repeater 419 may buffer the first read gating clock GCLKR1 by the first read enable signal REN1 that is activated when a read operation is performed so that the first read signal ERD1 is activated to generate the first read repeating clock RCLKR1. The clock repeater 419 may block an operation of generating the first read repeating clock RCLKR1 from the first read gating clock GCLKR1 when a write operation is performed so that the first write shifting flag WSF1 whose logic level is changed into an inactivated state by the activated first write signal EWT1 is received. In the electronic device 120b according to the present embodiment, the operation of generating the first read repeating clock RCLKR1 is blocked during the write flag period in which the write operation is performed and the first write shifting flag WSF1 is maintained in an inactivated state, thereby preventing power consumption for generating unnecessary clocks in the write operation.

The clock repeater 419 may generate the second read repeating dock RCLKR2 from the second read gating clock GCLKR2 based on the second write shifting flag WSF2 and the second read enable signal REN2. The clock repeater 419 may buffer the second read gating clock GCLKR2 to generate the second read repeating clock RCLKR2 when the second write shifting flag WSF2 initialized to an activated state and the second read enable signal REN2 initialized to an inactivated state are input before the second write signal EWT2 or the second read signal ERD2 is activated. The clock repeater 419 may buffer the second read gating clock GCLKR2 by the second read enable signal REN2 that is activated when a read operation is performed and the second read signal ERD2 is activated to generate the second read repeating clock RCLKR2. The clock repeater 419 may block an operation of generating the second read repeating clock RCLKR2 from the second read gating clock GCLKR2 when a write operation is performed so that the second write shifting flag WSF2 transitioned to an inactivated state by the activated second write signal EWT2 is received. In the electronic device 120b according to the present embodiment, the operation of generating the second read repeating clock RCLKR2 is blocked during the write flag period in which the write operation is performed and the second write shifting flag WSF2 is maintained in an inactivated state, thereby preventing power consumption for generating unnecessary clocks in the write operation.

The write control circuit 421 may receive the first write pulse WPUL1 and the second write pulse WPUL2 from the shifting circuit 417. The write control circuit 421 may control an operation in which data is input in a write operation when the first write pulse WPUL1 is activated. The write control circuit 421 may control an operation in which data is input in a write operation when the second write pulse WPUL2 is activated.

The read control circuit 423 may receive the first read pulse RPUL1 and the second read pulse RPUL2 from the shifting circuit 417. The read control circuit 423 may control an operation in which data is output in a read operation when the first read pulse RPUL1 is activated. The read control circuit 423 may control an operation in which data is output in a read operation when the second read pulse RPUL2 is activated.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all distinctive features of equivalent scope should be construed as being included in the concepts.

What is claimed is:

1. An electronic device comprising:
   a shifting circuit configured to generate a write shifting flag that is inactivated when a write signal for a write operation is activated; and
   a dock repeater configured to block generation of a read repeating clock that is used in a read operation when the write shifting flag is inactivated.

2. The electronic device of claim 1, further comprising a command decoder configured to generate the write signal by decoding an internal command according to a chip selection signal.

3. The electronic device of claim 2, further comprising a detection signal generation circuit configured to generate a detection signal that is activated when the internal chip selection signal is activated.

4. The electronic device of claim 3, further comprising:
   a latch dock generation circuit configured to generate a latch clock from an internal dock based on the detection signal;
   a chip selection signal buffer circuit configured to generate the internal chip selection signal based on the latch clock and a chip selection signal; and
   a command buffer circuit configured to generate the internal command based on the latch dock and a command.

5. The electronic device of claim 1, wherein the shifting circuit is configured to change a logic level of the write shifting flag initialized to an activated state into an inactivated state when the write signal is activated according to a first write command.

6. The electronic device of claim 5, wherein the shifting circuit is configured to generate the write shifting flag that maintains an inactivated state for as long as a write flag period from a time point when the write signal is activated.

7. The electronic device of claim 1, wherein the shifting circuit is configured to change a logic level of the write enable signal initialized to an inactivated state into an activated state when the write signal is activated according to a first write command.

8. The electronic device of claim 7, wherein the shifting circuit is configured to generate the write enable signal that maintains an activated state for as long as a write enable period from a time point when the write signal is activated.

9. The electronic device of claim 1, wherein the dock repeater is configured to generate the read repeating dock from a read gating clock when the write shifting flag is activated or the write enable signal is activated.

10. The electronic device of claim 9, further comprising a gating dock generation circuit configured to generate the read gating clock from the internal clock when a detection signal generated according to the chip selection signal is activated.

11. The electronic device of claim 1, wherein the shifting circuit is configured to generate a read shifting flag that is inactivated when a read signal for a read operation is activated.

12. The electronic device of claim 11, wherein the shifting circuit is configured to:
change a logic level of the read shifting flag initialized to an activated state into an inactivated state when the read signal is activated according to a first read command; and
generate the read shifting flag that maintains an inactivated state for a duration of a read flag period from a time point when the read signal is activated.

13. The electronic device of claim 11, wherein the shifting circuit is configured to:
change a logic level of a read enable signal initialized to an inactivated state into an activated state when the read signal is activated according to a first read command; and
generate the read enable signal that maintains an activated state for a duration of a read enable period from a time point when the read signal is activated.

14. The electronic device of claim 11, wherein the clock repeater is configured to block generation of a write repeating clock used in a write operation when the read shifting flag is inactivated.

15. The electronic device of claim 14, wherein the clock repeater is configured to generate the write repeating clock from a write gating clock when the read shifting flag is activated or the read enable signal is activated.

16. An electronic device comprising:
a shifting circuit configured to generate a read shifting flag that is inactivated when a read signal for a read operation is activated; and
a dock repeater configured to block generation of a write repeating clock that is used in a write operation when the read shifting flag is inactivated.

17. The electronic device of claim 16, wherein the shifting circuit is configured to:
change a logic level of the read shifting flag initialized to an activated state into an inactivated state when the read signal is activated according to a first read command; and
generate the read shifting flag that maintains an inactivated state for a duration of a read flag period from a time point when the read signal is activated.

18. The electronic device of claim 16, wherein the shifting circuit is configured to:
change a logic level of a read enable signal initialized to an inactivated state into an activated state when the read signal is activated according to a first read command; and
generate the read enable signal that maintains an activated state for a duration of a read enable period from a time point when the read signal is activated.

19. The electronic device of claim 16, wherein the clock repeater is configured to generate the write repeating clock from a write gating dock when the read shifting flag is activated or the read enable signal is activated.

20. An electronic device comprising:
a command decoder configured to decode an internal command according to an internal chip selection signal to generate a write signal and a read signal;
a shifting circuit configured to generate a write shifting flag and a write enable signal based on the write signal, and generates a read shifting flag and a read enable signal based on the read signal; and
a clock repeater configured to generate a read repeating clock from a read gating clock based on the write shifting flag and the read enable signal.

21. The electronic device of claim 20, wherein the shifting circuit is configured to:
change a logic level of the write shifting flag initialized to an activated state into an inactivated state when the write signal is activated according to a first write command; and
generate the write shifting flag that maintains an inactivated state for a duration of a write flag period from a time point when the write signal is activated.

22. The electronic device of claim 20, wherein the shifting circuit is configured to:
change a logic level of the write enable signal initialized to an inactivated state into an activated state when the write signal is activated according to a first write command; and
generate the write enable signal that maintains an activated state for a duration of a write enable period from a time point when the write signal is activated.

23. The electronic device of claim 20, wherein the shifting circuit is configured to:
change a logic level of the read shifting flag initialized to an activated state into an inactivated state when the read signal is activated according to a first read command; and
generate the read shifting flag that maintains an inactivated state for a duration of a read flag period from a time point when the read signal is activated.

24. The electronic device of claim 20, wherein the shifting circuit is configured to:
change a logic level of the read enable signal initialized to an inactivated state into an activated state when the read signal is activated according to a first read command; and
generate the read enable signal that maintains an activated state for a duration of a read enable period from a time point when the read signal is activated.

25. The electronic device of claim 20, wherein the clock repeater is configured to generate a write repeating clock from a write gating clock based on the read shifting flag and the write enable signal.

* * * * *